(12) United States Patent
Chen et al.

(10) Patent No.: US 12,020,950 B2
(45) Date of Patent: Jun. 25, 2024

(54) SEMICONDUCTOR STRUCTURE AND METHOD FOR FORMING THEREOF

(71) Applicant: TAIWAN SEMICONDUCTOR MANUFACTURING COMPANY LTD., Hsinchu (TW)

(72) Inventors: I-Sheng Chen, Taipei (TW); Siao-Jing Li, Hsinchu (TW); Yi-Jing Li, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/153,343

(22) Filed: Jan. 11, 2023

(65) Prior Publication Data

US 2023/0162989 A1 May 25, 2023

Related U.S. Application Data

(63) Continuation of application No. 17/206,777, filed on Mar. 19, 2021, now Pat. No. 11,562,910.

(51) Int. Cl.
*H01L 21/322* (2006.01)
*H01L 21/265* (2006.01)
*H01L 21/28* (2006.01)
*H01L 29/49* (2006.01)
*H01L 29/66* (2006.01)
*H01L 29/78* (2006.01)

(52) U.S. Cl.
CPC .... *H01L 21/3221* (2013.01); *H01L 21/26506* (2013.01); *H01L 21/28088* (2013.01); *H01L 29/4966* (2013.01); *H01L 29/66545* (2013.01); *H01L 29/66818* (2013.01); *H01L 29/7851* (2013.01); *H01L 29/7853* (2013.01)

(58) Field of Classification Search
CPC .......... H01L 21/3221; H01L 21/26506; H01L 21/28088; H01L 29/4966; H01L 29/66545; H01L 29/66818; H01L 29/7851; H01L 29/7853
See application file for complete search history.

(56) References Cited

U.S. PATENT DOCUMENTS

2012/0261758 A1* 10/2012 Lee ................. H01L 29/513
257/E21.24
2015/0162445 A1* 6/2015 Wu ................. H01L 29/7833
438/197
2019/0386112 A1* 12/2019 Lu ................. H01L 21/32132

* cited by examiner

*Primary Examiner* — Christine A Enad
(74) *Attorney, Agent, or Firm* — WPAT LAW; Anthony King

(57) ABSTRACT

A semiconductor structure and a method for forming a semiconductor structure are provided. In some embodiments, a method is provided. The method includes following operations. A sacrificial gate structure is formed over a fin structure. The sacrificial gate structure includes a sacrificial gate layer and a sacrificial dielectric layer. The sacrificial gate layer is removed to form a gate trench exposing the sacrificial dielectric layer. A doped region is formed in the fin structure covered by the sacrificial dielectric layer. The sacrificial dielectric layer, a portion of the doped region and a portion of the fin structure are removed from the gate trench. An interfacial layer is formed over the fin structure in the gate trench.

20 Claims, 23 Drawing Sheets

SEMICONDUCTOR STRUCTURE AND METHOD FOR FORMING THEREOF

PRIORITY CLAIM AND CROSS-REFERENCE

This application is a continuation of U.S. patent application Ser. No. 17/206,777, filed on Mar. 19, 2021, entitled of "SEMICONDUCTOR STRUCTURE AND METHOD FOR FORMING THEREOF", the disclosure of which is hereby incorporated by reference in its entirety.

BACKGROUND

Electronic equipment involving semiconductor devices is essential for many modern applications. Technological advances in materials and design have produced generations of semiconductor devices, in which each generation includes smaller and more complex circuits than the previous generation. This scaling down process has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of fabricating FinFET devices have been generally adequate for their intended purposes, they have not been entirely satisfactory in all respects. For example, replacing a polysilicon gate electrode with a metal gate electrode raises challenges in a FinFET process development. It is desired to have improvements in this area.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
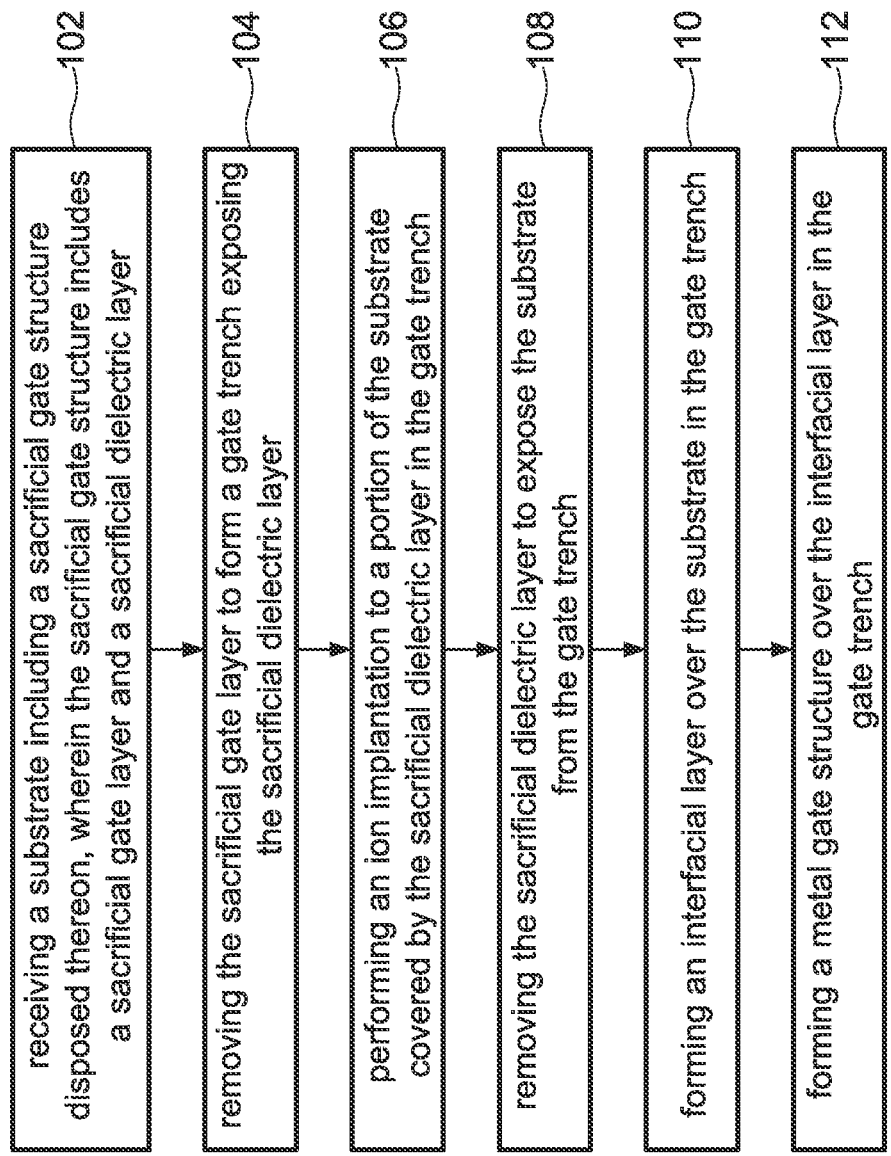
FIG. 1 is a flowchart representing a method for forming a semiconductor structure according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

As technology nodes achieve progressive smaller scales, in some integrated circuit (IC) designs, researchers have hoped to replace the polysilicon gate with a metal gate to improve device performance with the decreased feature sizes. One approach of forming the metal gate is called a "gate-last" approach, sometimes referred to as replacement polysilicon gate (RPG) approach. In an RPG approach, the metal gate is fabricated last, which allows for a reduced number of subsequent operations. However, the RPG approach is a complicated approach, and many issues arise.

For example, with a high-k metal gate last (HKMG) operation, an operation of removing the polysilicon gate (also referred to as dummy gate or sacrificial gate) in order to replace the polysilicon gate with the desired metal gate is required. During the removing of the polysilicon gate, in some embodiments, not only is the polysilicon gate removed, but the spacers adjacent to the polysilicon gate are consumed, and thus the size of the gate trench may be increased. An oxide cleaning operation may be subsequently performed after the removing of the polysilicon gate. During the oxide cleaning operation, the pad dielectric layer may be consumed. In some embodiments, not only is the pad dielectric layer consumed, but the spacers adjacent to the pad dielectric layer are also etched during the oxide cleaning operation, and thus the size of the gate trench may be increased. The gate trench may have non-uniform sidewalls due to the etched spacers. The gate trench may be filled with the materials used to form the metal gate. The metal gate may have protrusions extending into the etched spacers. The protrusions of the metal gate, known as the "footing" of the metal gate, may result in gate length non-uniformity issues. As a result, the device performance of the semiconductor structure may be reduced.

Embodiments of a method for forming a semiconductor structure are therefore provided. The semiconductor structure is formed in an RPG or gate-last process in accordance with the embodiments. The semiconductor structure may be formed in a planar device process according to some embodiments. The semiconductor structure may be formed in a non-planar device in alternative embodiments. In some embodiments, the method for forming the semiconductor structure includes introducing a surface treatment to the substrate under the pad dielectric layer. The surface treatment may facilitate the forming of a curved upper surface of the substrate. The curved upper surface of the substrate may create a shrink space for the materials used to form the metal gate. Accordingly, the metal gate formed thereon may have smaller footings or may substantially have no footings. Further, the metal gate formed thereon may have a shorter gate length. Briefly speaking, the method for forming the semiconductor structure mitigates the gate length non-uniformity issues, and thus the device performance of the semiconductor structure is improved.

FIG. 1 is a flowchart representing a method 10 for forming a semiconductor structure 20 according to aspects of the present disclosure in one or more embodiments. The method 10 for forming the semiconductor structure 20 includes an operation 102 where a substrate is received. In some embodiments, the substrate includes a sacrificial gate structure disposed thereon. In some embodiments, the substrate includes fin structures, and the sacrificial gate structure is disposed across the fin structures. In some embodiments, the sacrificial gate structure includes a sacrificial gate layer and a sacrificial dielectric layer. The method 10 further includes an operation 104 where the sacrificial gate layer is removed to form a gate trench exposing the sacrificial dielectric layer. The method 10 further includes an operation 106 where an ion implantation is performed to a portion of the substrate covered by the sacrificial dielectric layer in the gate trench. The method 10 further includes an operation 108 where the sacrificial dielectric layer is removed to expose the substrate from the gate trench. The method 10 further includes an operation 110 where an interfacial layer is formed over the substrate in the gate trench. The method 10 further includes an operation 112 where a metal gate structure is formed over the interfacial layer in the gate trench.

Figure 2:
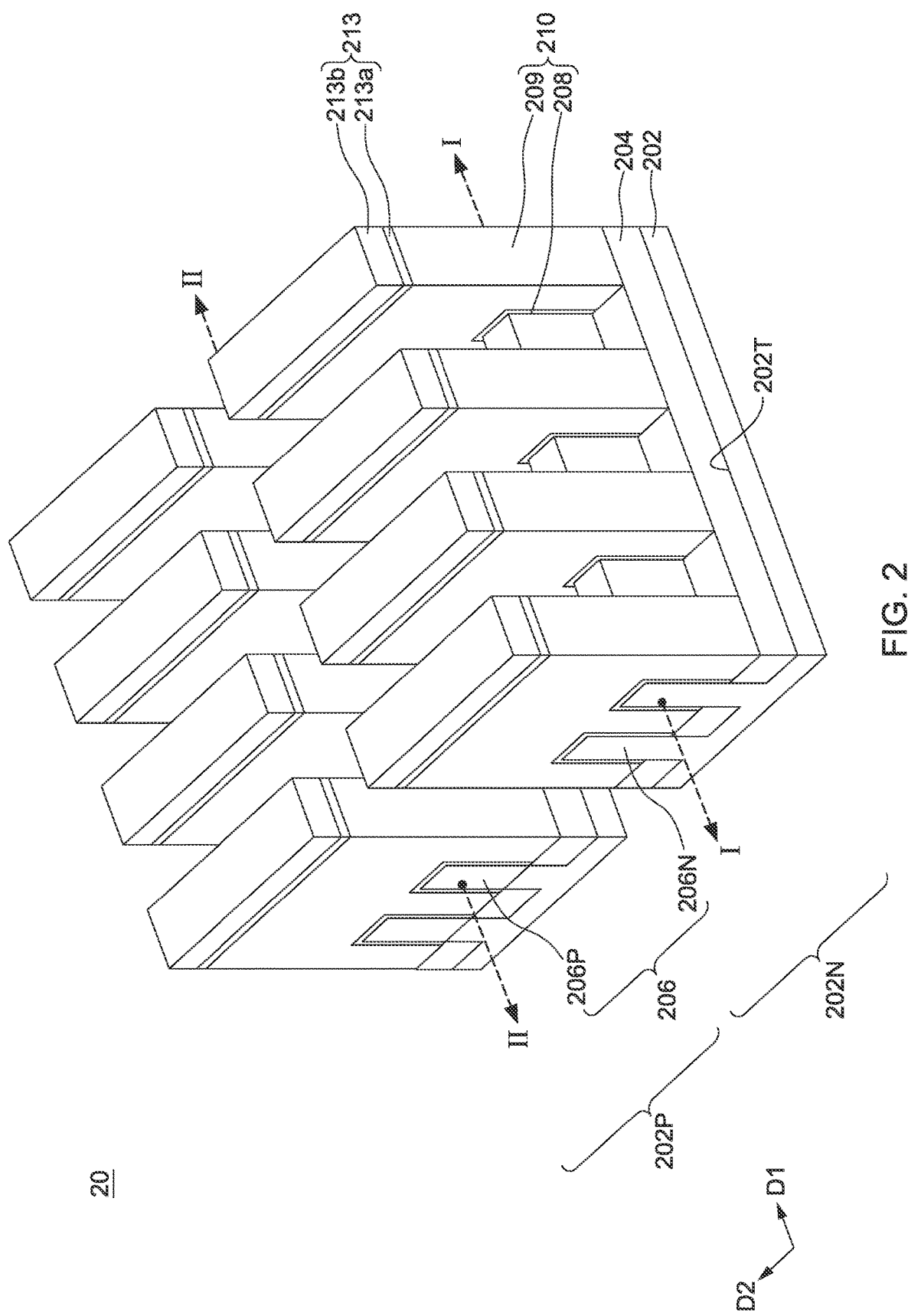
FIG. 2 is a schematic drawing illustrating a semiconductor structure at a fabrication stage constructed according to aspects of the present disclosure.

FIG. 2 is a schematic drawing illustrating the semiconductor structure 20 at a fabrication stage constructed according to aspects of the present disclosure in one or more embodiments. As shown in FIG. 2, a substrate 202 is received according to operation 102. The substrate 202 may be a semiconductor wafer such as a silicon wafer. Alternatively or additionally, the substrate 202 may include elementary semiconductor materials, compound semiconductor materials, or alloy semiconductor materials. Examples of elementary semiconductor materials may be, for example but not limited thereto, single crystal silicon, polysilicon, amorphous silicon, germanium (Ge), and/or diamond. Examples of compound semiconductor materials may be, for example but not limited thereto, silicon carbide (SiC), gallium arsenic (GaAs), gallium phosphide (GaP), indium phosphide (InP), indium arsenide (InAs), and/or indium antimonide (InSb). Examples of alloy semiconductor material may be, for example but not limited thereto, SiGe, GaAsP, AlInAs, AlGaAs, GaInAs, GaInP, and/or GaInAsP.

The substrate 202 may include various doping configurations depending on design requirements as is known in the art. For example, different doping profiles (e.g., n wells, p wells) may be formed on the substrate 202 in regions designed for different device types (e.g., n-type field effect transistors (NFET), p-type field effect transistors (PFET)). The suitable doping may include ion implantation of dopants and/or diffusion processes. The substrate 202 has an n-type region 202N and a p-type region 202P. The n-type region 202N may be used for forming n-type devices, such as NMOS transistors, e.g., NFETs. The p-type region 202P may be used for forming p-type devices, such as PMOS transistors, e.g., PFETs. The n-type region 202N may be physically separated from the p-type region 202P, and any number of device features (e.g., other active devices, doped regions, isolation structures, etc.) may be disposed between the n-type region 202N and the p-type region 202P. The substrate 202 typically has isolation structures (e.g., shallow trench isolation (STI) structures) 204 interposing the regions containing different device types.

In some embodiments, the substrate 202 may include fin structures 206 electrically isolated from each other by the isolation structures 204. In some embodiments, the fin structure 206 extends along a first direction D1. In some embodiments, the fin structures 206 have a fin height ranges from approximately 30 nanometers to approximately 65 nanometers. The fin structures 206 have fin structures 206N disposed in the n-type region 202N and fin structures 206P disposed in the p-type region 202P. In various embodiments, upper portions of the fin structures 206 may be formed from silicon-germanium (SiGe), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like. In some embodiments, upper portions of the fin structures 206P may be formed from silicon-germanium (SiGe), while upper portions of the fin structures 206N may be formed from materials similar to those of the substrate 202.

In some embodiments, a semiconductor layer, which may serve as a sacrificial gate layer 209 in subsequent operations, is formed over the substrate 202. In some embodiments, a dielectric layer, which may serve as a sacrificial dielectric layer 208 in subsequent operations, may be formed prior to the forming of the semiconductor layer. In some embodiments, the semiconductor layer is made of polysilicon, but the disclosure is not limited thereto. In some embodiments, the dielectric layer includes silicon oxide (SiO), but the disclosure is not limited thereto. The dielectric layer may be formed to cover sidewalls of the fin structure 206 and a top surface of the fin structure 206. In some embodiments, the dielectric layer is formed by a thermal oxidation operation. In such embodiments, the dielectric layer is formed over the fin structures 206, while upper surfaces of the isolation structure 204 are exposed.

The semiconductor layer and the dielectric layer are patterned to form a sacrificial gate structure 210, as shown in FIG. 2. The sacrificial gate structure 210 includes a sacrificial gate layer 209 and a sacrificial dielectric layer 208. The sacrificial gate structure 210 is disposed across the fin structures 206. In some embodiments, a patterned hard mask 213 may be formed over the semiconductor layer for defining a location and a dimension of the sacrificial gate structure 210. In some embodiments, the patterned hard mask 213 may include silicon nitride (SiN), but the disclosure is not limited thereto. The patterned hard mask 213 may include a single-layered structure or a multiple layered structure. For example, the patterned hard mask 213 may be a bi-layered structure as shown in FIG. 2, but the disclosure is not limited thereto. In some embodiments, the bi-layered patterned hard mask 213 may include a first patterned layer 213a and a second patterned layer 213b. The first and second patterned layers 213a and 213b may include a same material or different materials, depending on different implementations. Further, thicknesses of the first and second patterned layers 213a and 213b may be different. For example, the thickness of the first patterned layer 213a may be less than the thickness of the second patterned layer 213b.

The sacrificial gate structure 210 extends along a second direction D2 different from the first direction D1. For example, the second direction D2 may be perpendicular to the first direction D1. Additionally, the first direction D1 and the second direction D2 are in the same horizontal plane. The sacrificial gate structure 210 covers a portion of the fin structure 206 as shown in FIG. 2. In other words, the sacrificial gate structure 210 is at least partially disposed over the fin structure 206, and the portion of the fin structure 206 underlying the sacrificial gate structure 210 may be referred to as the channel region. The sacrificial gate structure 210 may also define a source/drain region of the fin structure 206, for example, as portions of the fin structure 206 adjacent to and on opposing sides of the channel region.

Figure 3:
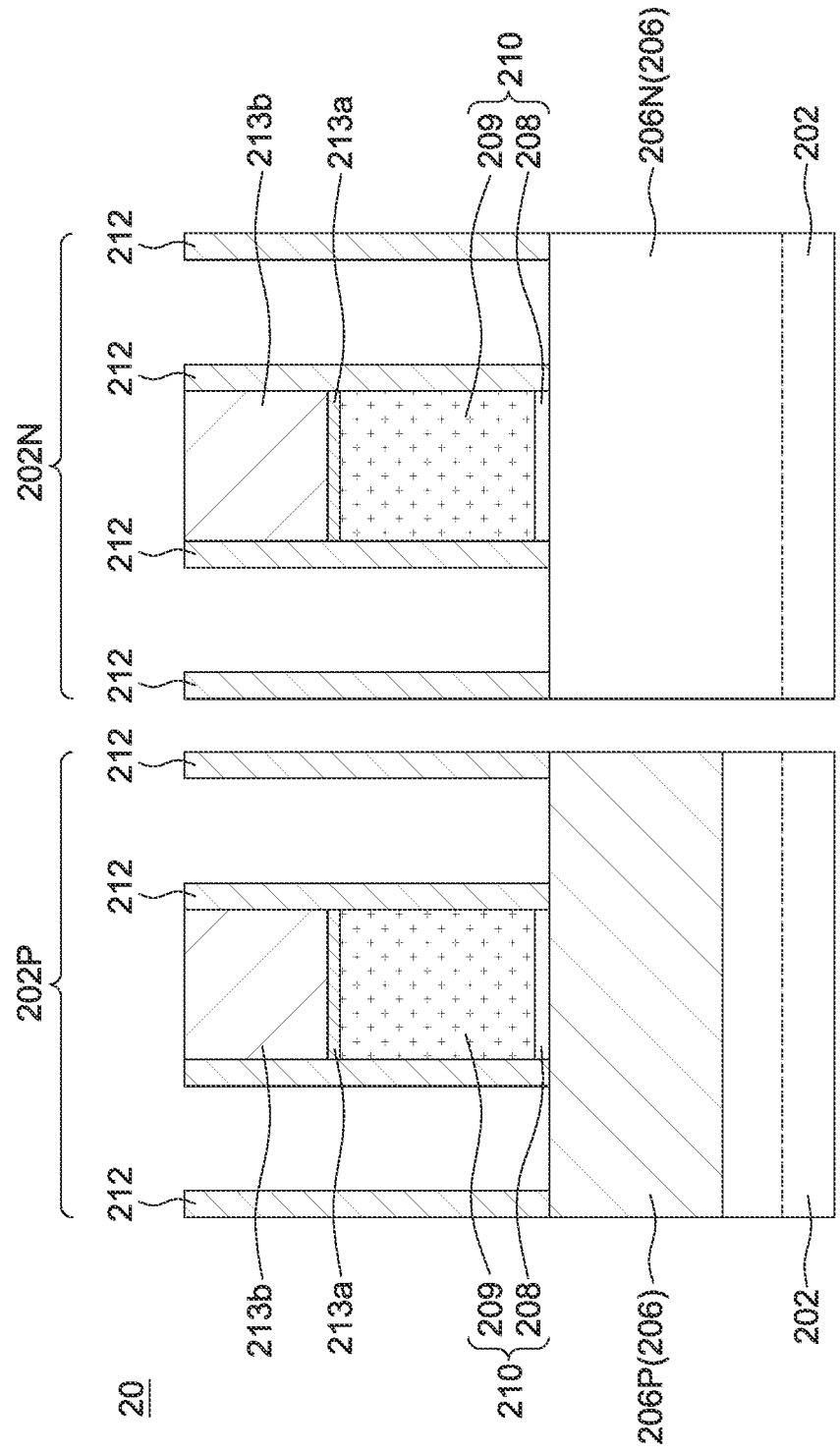
FIGS. 3 through 6 are cross-sectional views illustrating a semiconductor structure at different fabrication stages constructed according to aspects of the present disclosure.

FIGS. 3 through 6 are cross-sectional views illustrating the semiconductor structure 20 at different fabrication stages constructed according to aspects of the present disclosure in one or more embodiments. Further, FIGS. 3 through 6 are cross-sectional views illustrated along a similar cross-section as reference cross-section I-I (n-type region 202N) and reference cross-section II-II (p-type region 202P) in FIG. 2. Referring to FIG. 3, spacers 212 are formed over sidewalls of the sacrificial gate structure 210. The sacrificial gate structure 210 may be disposed between a pair of spacers 212. The spacers 212 may be formed by conformally depositing one or more insulating material(s) and subsequently etching the insulating material(s). The insulating material(s) may be formed of low-k dielectric materials such as silicon oxide, silicon nitride, silicon carbonitride, silicon oxycarbonitride, a combination thereof, or the like, which may be formed by a conformal deposition process such as chemical vapor deposition (CVD), plasma enhanced chemical vapor deposition (PECVD), atomic layer deposition (ALD), or the like. The insulating material(s), when etched, have portions left on the sidewalls of the sacrificial gate structure 210 and the patterned hard mask 213 (hence forming the spacers 212). After the etching, the spacers 212 may have straight sidewalls (as illustrated) or may have curved sidewalls (not illustrated).

Figure 4:
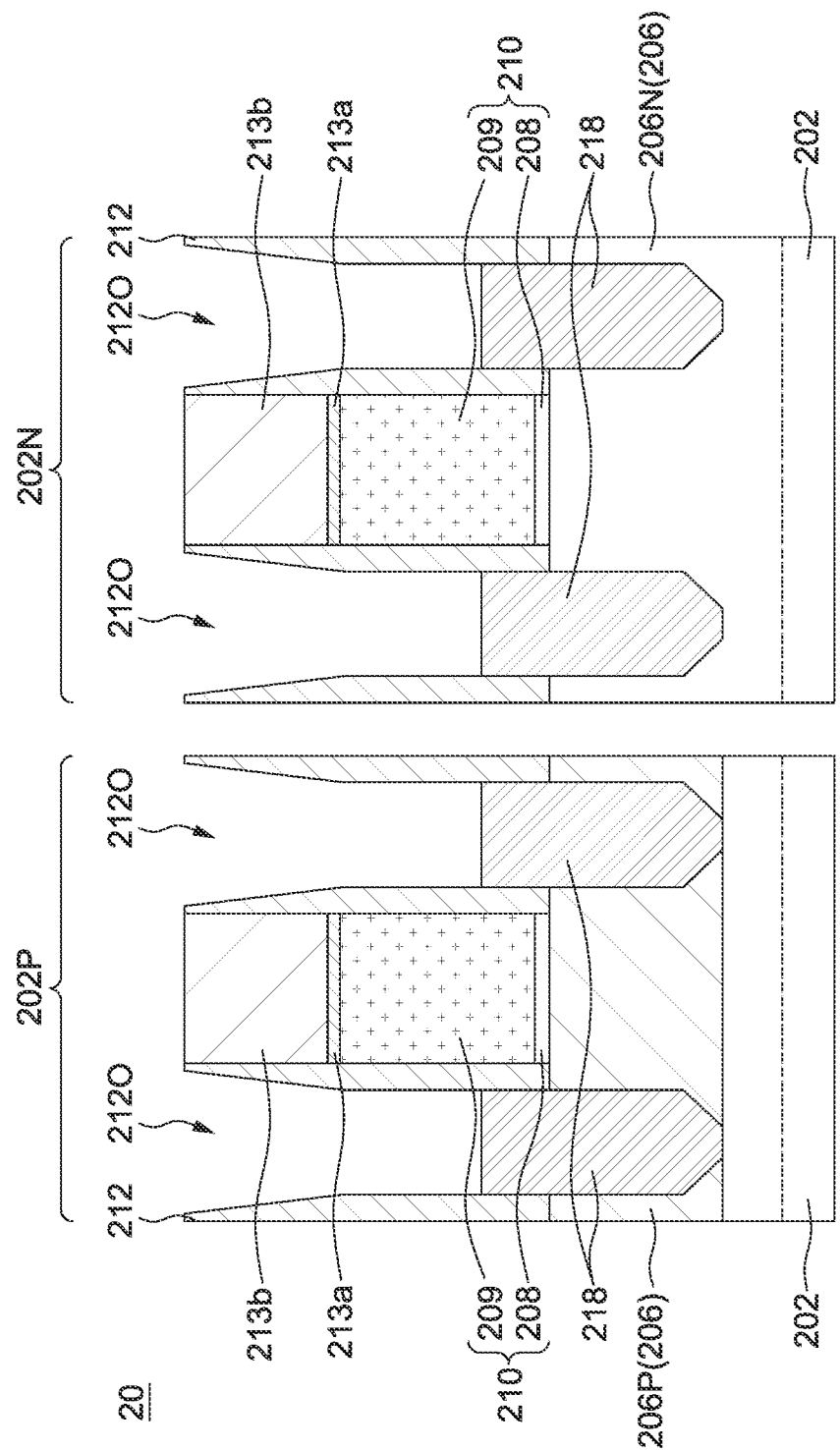

Referring to FIG. 4, source/drain (S/D) structures 218 are formed in the fin structures 206. The S/D structures 218 are formed in the fin structures 206 such that each sacrificial gate structure 210 is disposed between respective neighboring pairs of the S/D structures 218. In some embodiments, the S/D structures 218 may extend into, and may also penetrate through, the fin structures 206. In some embodiments, the S/D structures 218 are strained S/D structures. In such embodiments, portions of the fin structures 206 exposed from the sacrificial gate structures 210 may be removed, thereby a plurality of recesses may be obtained. An epitaxial growth operation may be performed to form a strained material in the recesses of the fin structures 206. In some embodiments, top surfaces of the S/D structures 218 may be higher than top surfaces of the fin structures 206. In some embodiments, an etching back operation is performed prior to the forming of the source/drain (S/D) structures 218. The etching back operation may be performed to etch a portion of the spacers 212, such that the opening 2120 between the spacers 212 for forming the source/drain (S/D) structures 218 is enlarged.

A material of the S/D structures 218 may be selected to exert stress in the respective channel regions. In some embodiments, a lattice constant of the S/D structures 218 may be different from a lattice constant of the substrate 202 and a lattice constant of the fin structure 206. In some embodiments, the S/D structures 218 may include Ge, SiGe, InAs, InGaAs, InSb, GaSb, InAlP, InP, or a combination thereof, but the disclosure is not limited thereto. In some embodiments, the spacers 212 are used to separate the S/D structures 218 from the sacrificial gate structure 210 by an appropriate lateral distance so that the S/D structures 218 do not short out subsequently formed gates of the resulting FinFETs.

Figure 5:
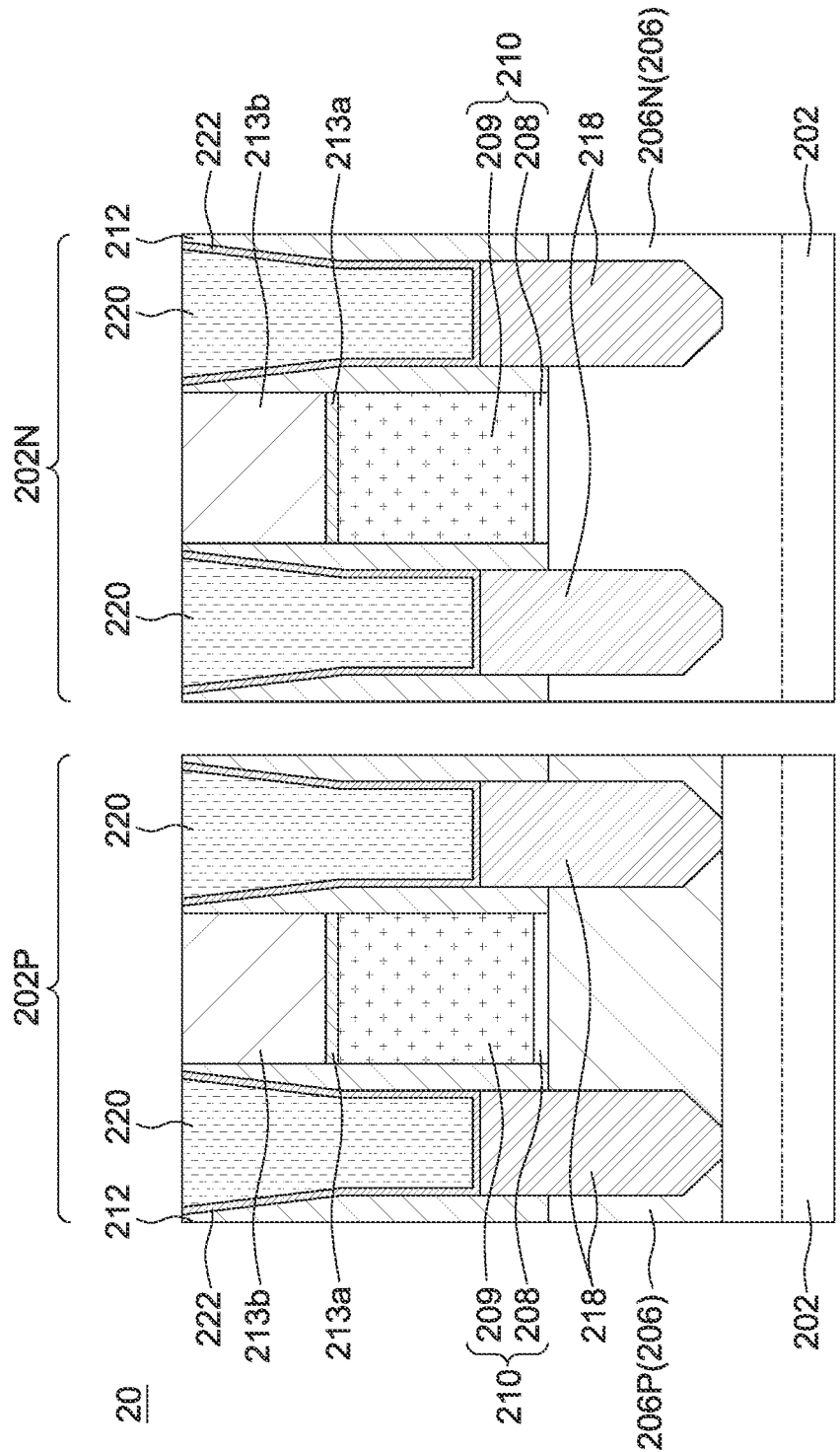

Referring to FIG. 5, a dielectric material layer 220 is formed over the substrate 202. The dielectric material layer 220 may be deposited over the S/D structures 218, the spacers 212, the isolation structures 204, and the patterned hard mask 213 (if present) or the sacrificial gate structures 210. The dielectric material layer 220 may be formed of a dielectric material, and may be deposited by any suitable method, such as CVD, plasma-enhanced CVD (PECVD), or FCVD. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, the dielectric material layer 220 may be referred to as an inter-layer dielectric (ILD).

Alternatively or additionally, a contact etch stop layer (CESL) 222 is formed over the substrate 202 prior to the formation of the dielectric material layer 220. The CESL 222 may be deposited over the S/D structures 218, the spacers 212, the isolation structures 204, and the patterned hard mask 213 (if present) or the sacrificial gate structures 210. The CESL 222 may be formed between the dielectric material layer 220 and the S/D structures 218, the spacers 212, the isolation structures 204, and the patterned hard mask 213 (if present) or the sacrificial gate structures 210. The CESL 222 may comprise a dielectric material, such as, silicon nitride, silicon oxide, silicon oxynitride, or the like, having a lower etch rate than the material of the dielectric material layer 220.

Figure 6:
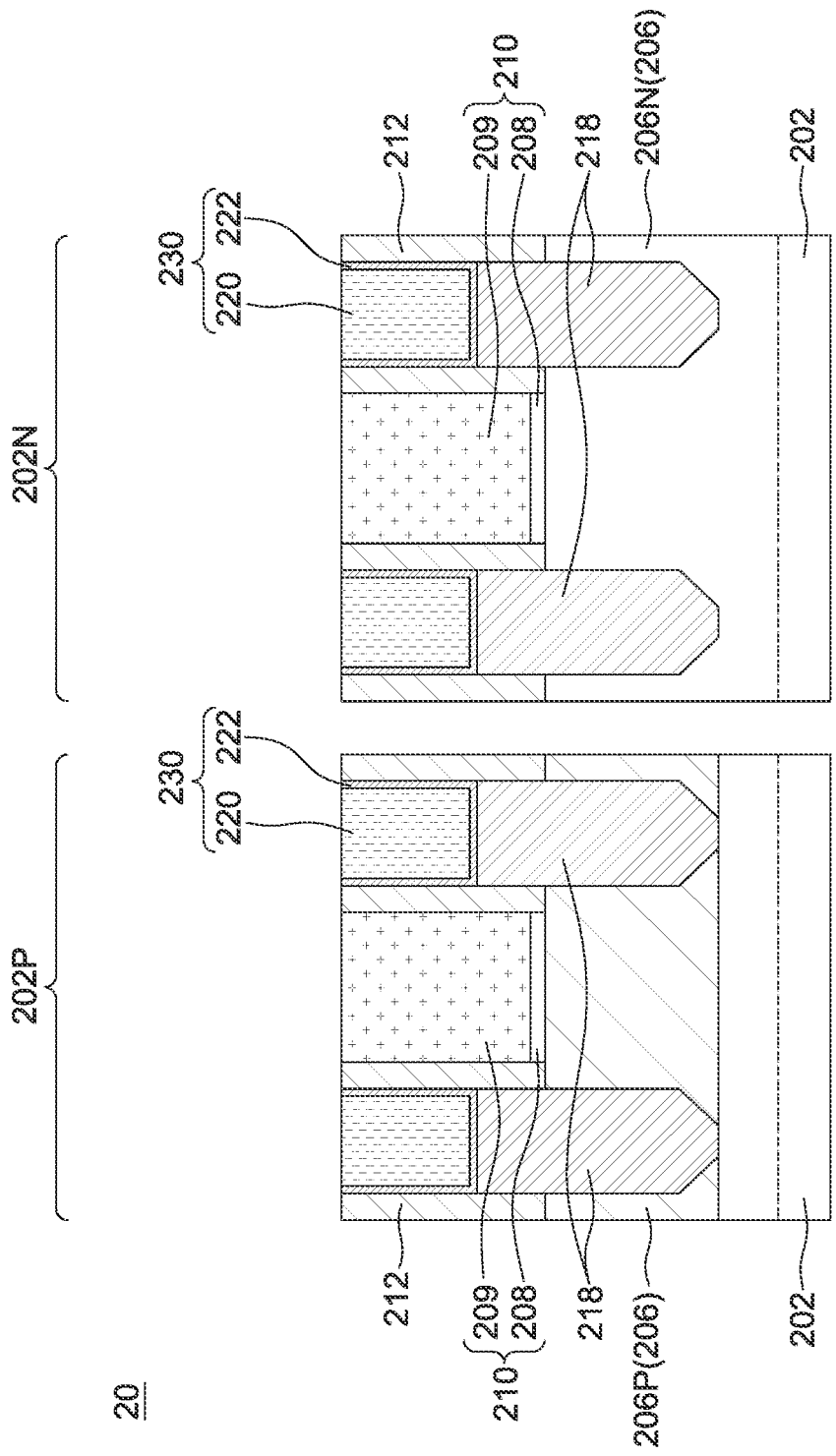

Referring to FIG. 6, a planarization process, such as a chemical mechanical planarization (CMP) operation, may be performed to level a top surface of the dielectric material layer 220 with a top surface of the patterned hard mask 213 (if present) or a top surface of the sacrificial gate structures 210. The planarization process may also remove the patterned hard mask 213 on the sacrificial gate structures 210, and portions of the spacers 212 along sidewalls of the patterned hard mask 213. After the planarization process, a dielectric structure 230 including the dielectric material layer 220 and the CESL 222 is formed. Top surfaces of the sacrificial gate structures 210, the spacers 212, and the dielectric structure 230 are coplanar (within process variations) after the planarization process. Accordingly, top surfaces of the sacrificial gate layers 209 of the sacrificial gate structures 210 are exposed through the dielectric structure 230. In some embodiments, the dielectric structure 230 has a thickness over the fin structures 206, wherein the thickness of the dielectric structure 230 ranges from approximately 30 nanometers to approximately 65 nanometers.

In some embodiments, the sacrificial gate structure 210 may be replaced with a metal gate structure 250 by operations described in operations 104 to 112, but the disclosure is not limited thereto.

Figure 7:
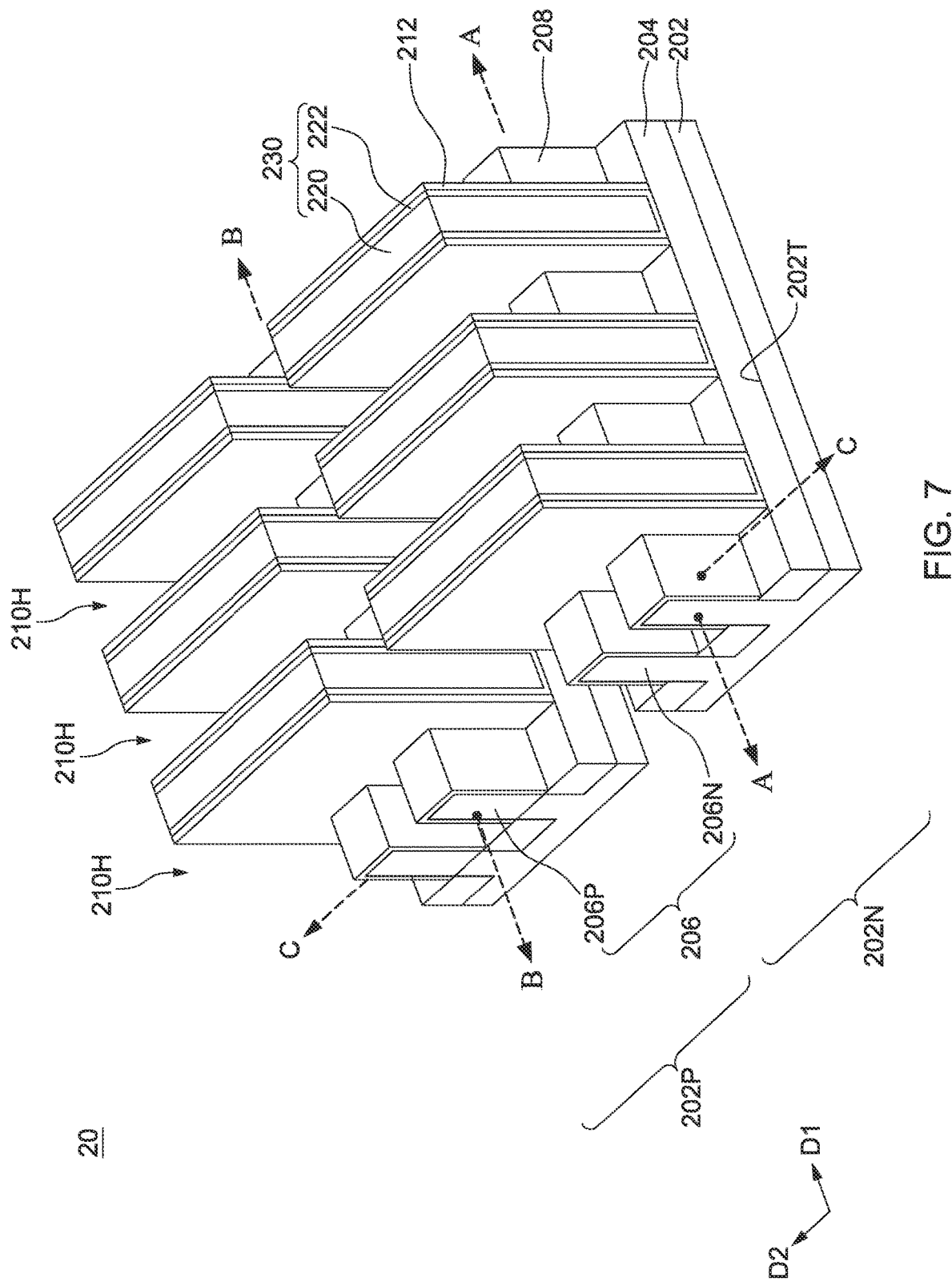
FIG. 7 is a schematic drawing illustrating a semiconductor structure at a fabrication stage constructed according to aspects of the present disclosure.
Figure 8A:
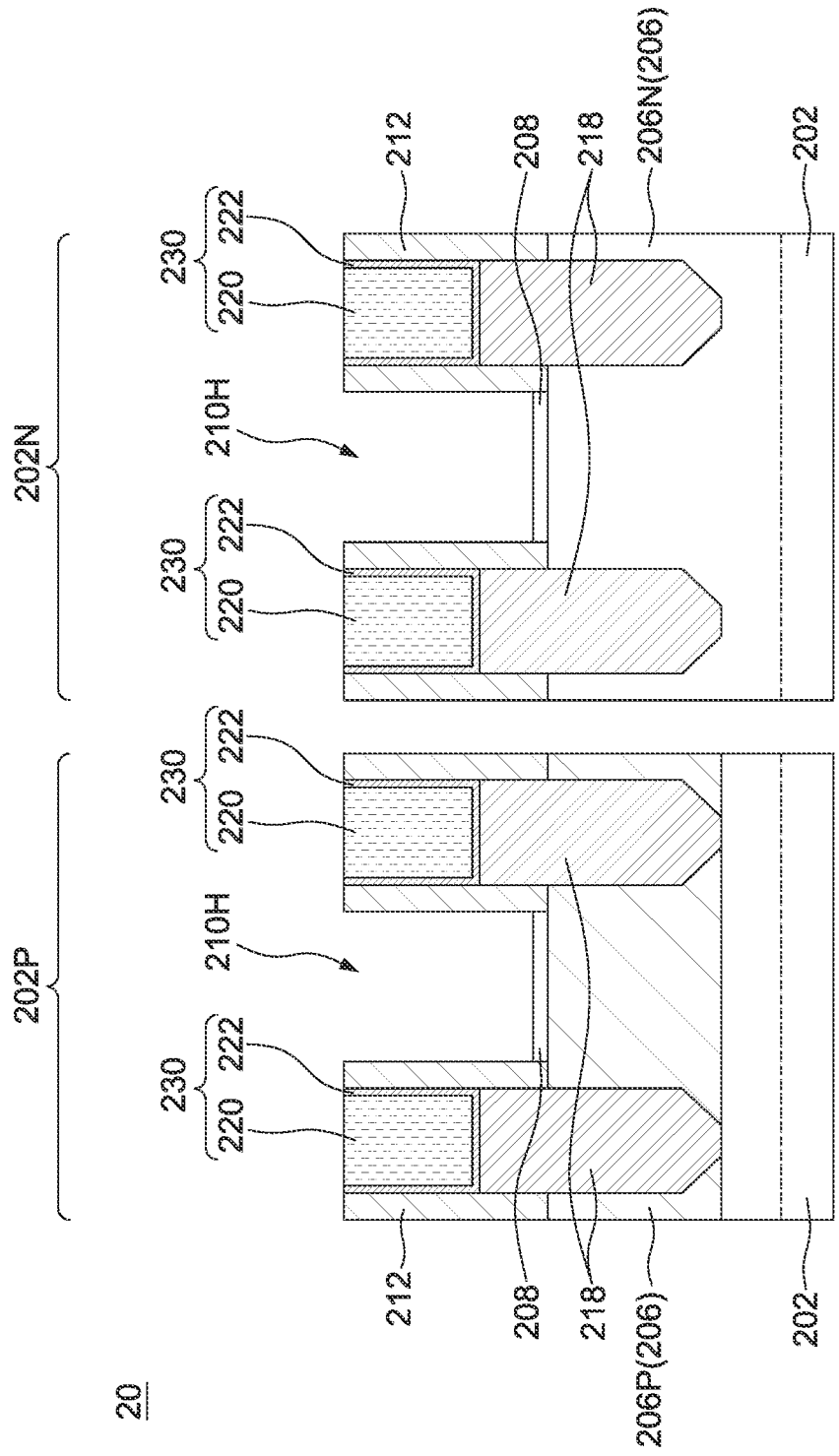
FIG. 8A is a cross-sectional view illustrated along a similar cross-section as reference cross-section A-A and reference cross-section B-B in FIG. 7.
Figure 8B:
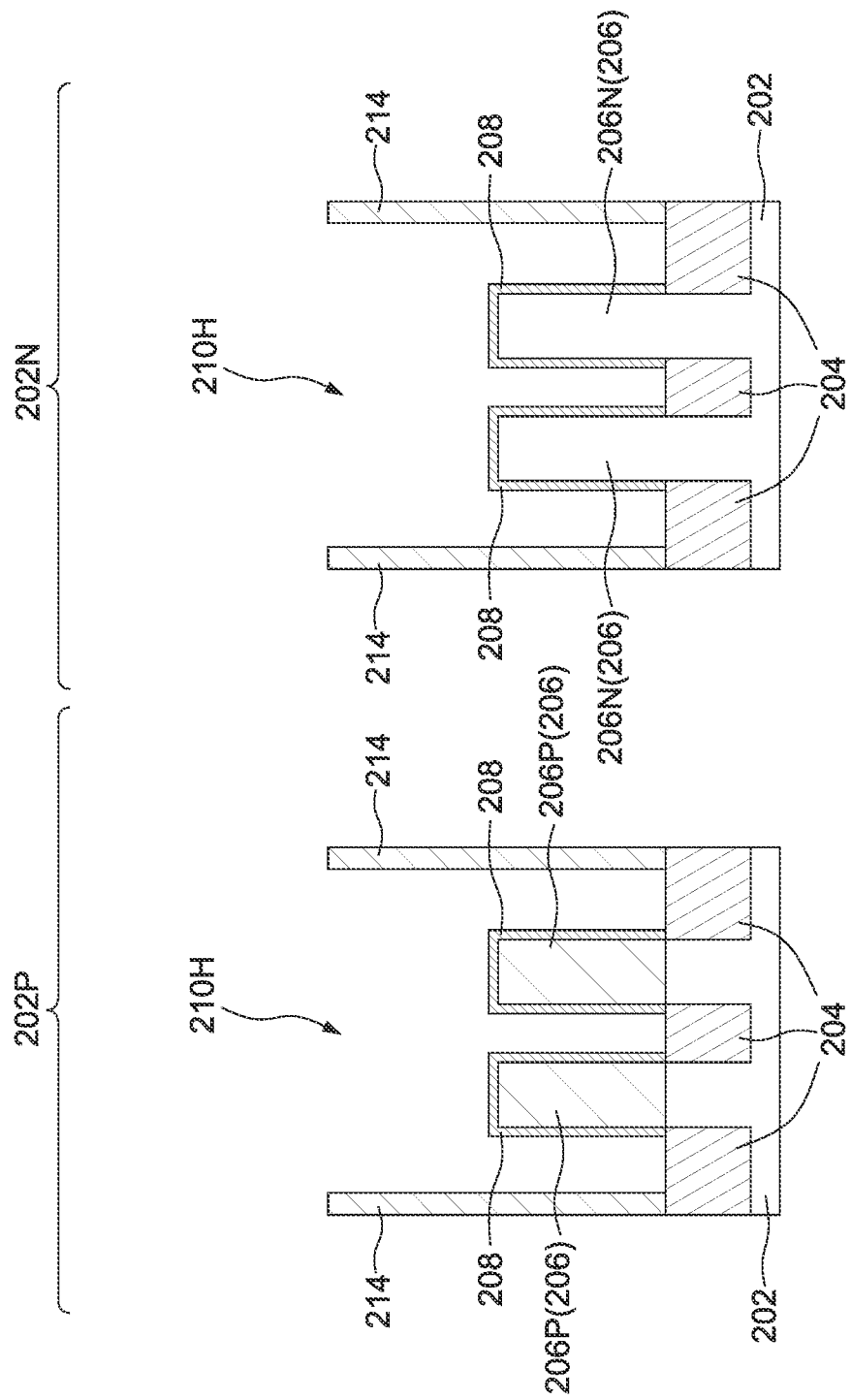
FIG. 8B is a cross-sectional view illustrated along a similar cross-section as reference cross-section C-C in FIG. 7.

FIG. 7 is a schematic drawing illustrating the semiconductor structure 20 at a fabrication stage constructed according to aspects of the present disclosure in one or more embodiments. Further, FIG. 8A is a cross-sectional view illustrated along a similar cross-section as reference cross-section A-A (n-type region 202N) and reference cross-section B-B (p-type region 202P) in FIG. 7, and FIG. 8B is a cross-sectional view illustrated along a similar cross-section as reference cross-section C-C in FIG. 7. Referring to FIGS. 7, 8A and 8B, the sacrificial gate layer 209 is removed to form a gate trench 210H exposing the sacrificial dielectric layer 208, according to operation 104. In some embodiments as shown in FIG. 7, the gate trench 210H further exposes the isolation structures 204. In some embodiments as shown in FIG. 8B, the fin structure 206 covered by the sacrificial dielectric layer 208 protrudes from the bottom of the gate trench 210H.

Referring to FIG. 8B, the gate trench 210H may be defined by insulating structures 214 along the cross-section C-C. In some embodiments, the gate trench 210H is surrounded by the dielectric structure 230 and the spacer 212. In such embodiments, the insulating structure 214 may be the dielectric structure 230 or the spacer 212. In some embodiments, the dielectric structure 230, the spacer 212 and other structure (i.e., a cut-poly (CPO) structure) may be collectively referred to as the insulating structure 214. In some embodiments, the insulating structure 214 along the cross-section C-C may be served as a pattern for defining a location and a dimension of the sacrificial gate structures 210. In some embodiments, the insulating structure 214 may include dielectric materials.

In some embodiments where an non-planar device is to be formed, a surface treatment, such as an ion implantation 900 (will be discussed in greater detail below), is introduced to the fin structures 206 under the sacrificial dielectric layer 208 (if present) by operations described in FIGS. 9, 10A, 10B and 11, but the disclosure is not limited thereto. In other embodiments where a planar device is to be formed, a surface treatment, such as the ion implantation 900, is introduced to the substrate 202 under the sacrificial dielectric layer 208 (if present) by operations similar to those described in FIGS. 9, 10A, 10B and 11.

Figure 9:
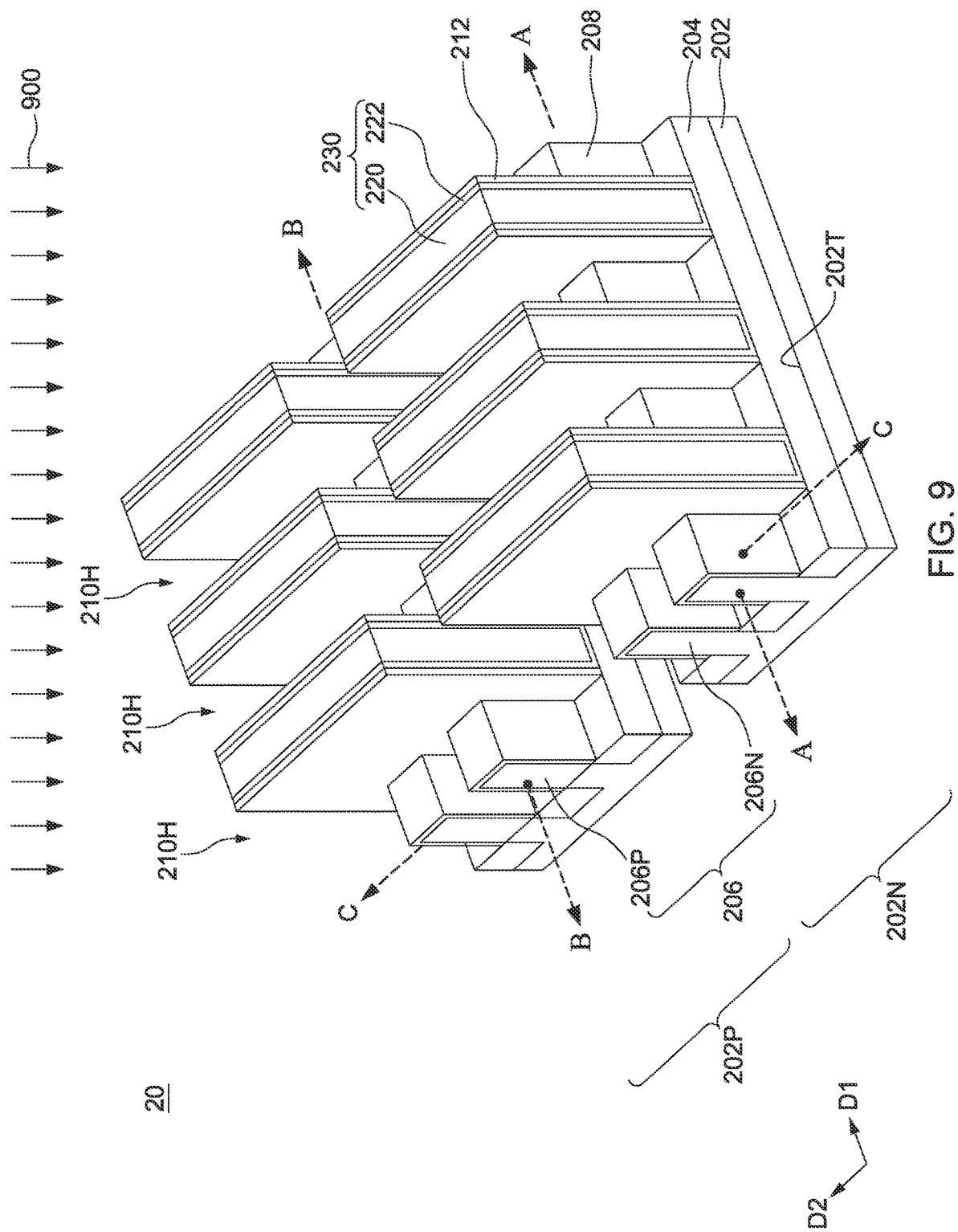
FIG. 9 is a schematic drawing illustrating a semiconductor structure at a fabrication stage constructed according to aspects of the present disclosure.
Figure 10A:
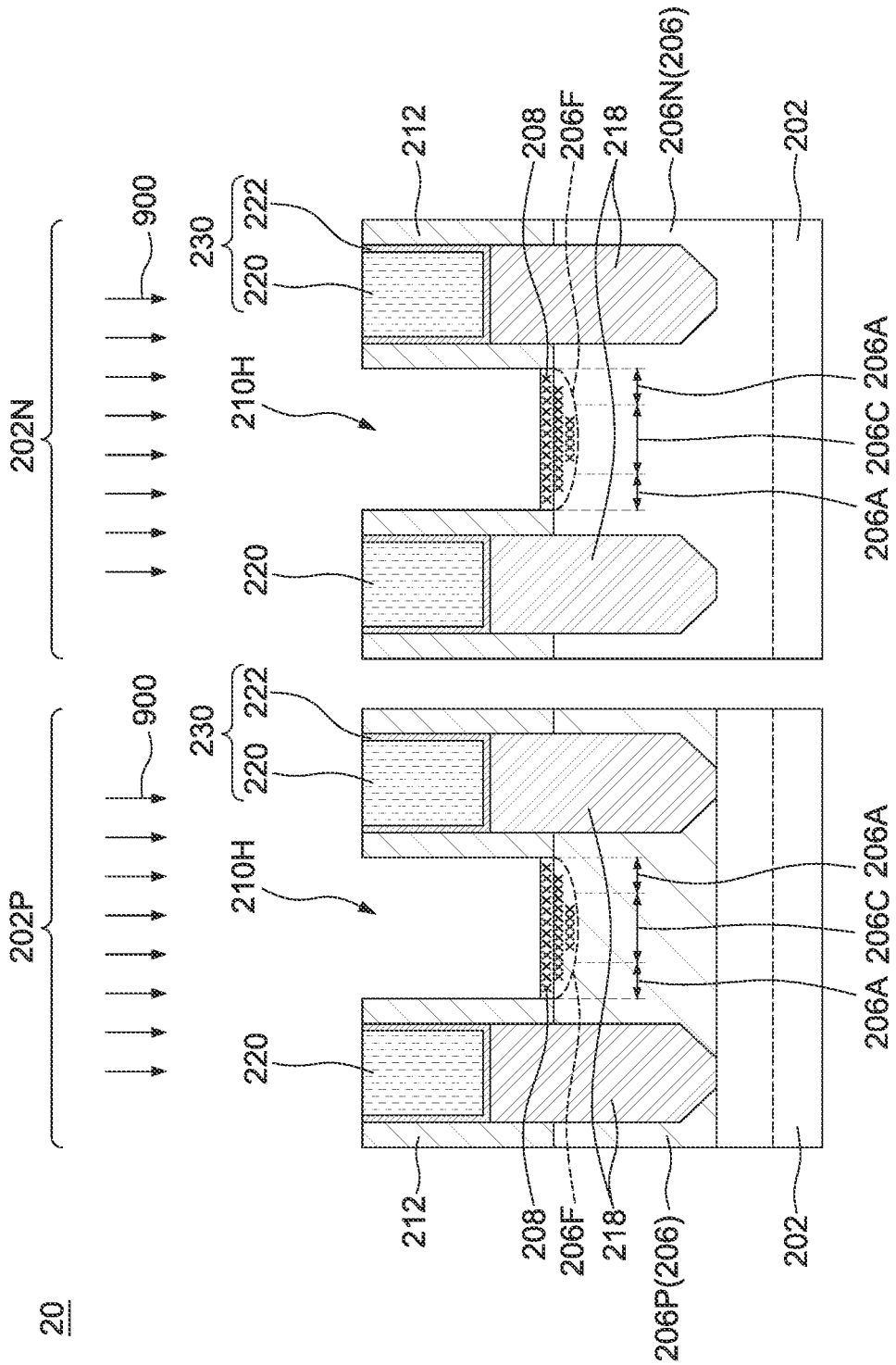
FIG. 10A is a cross-sectional view illustrated along a similar cross-section as reference cross-section A-A and reference cross-section B-B in FIG. 9.
Figure 10B:
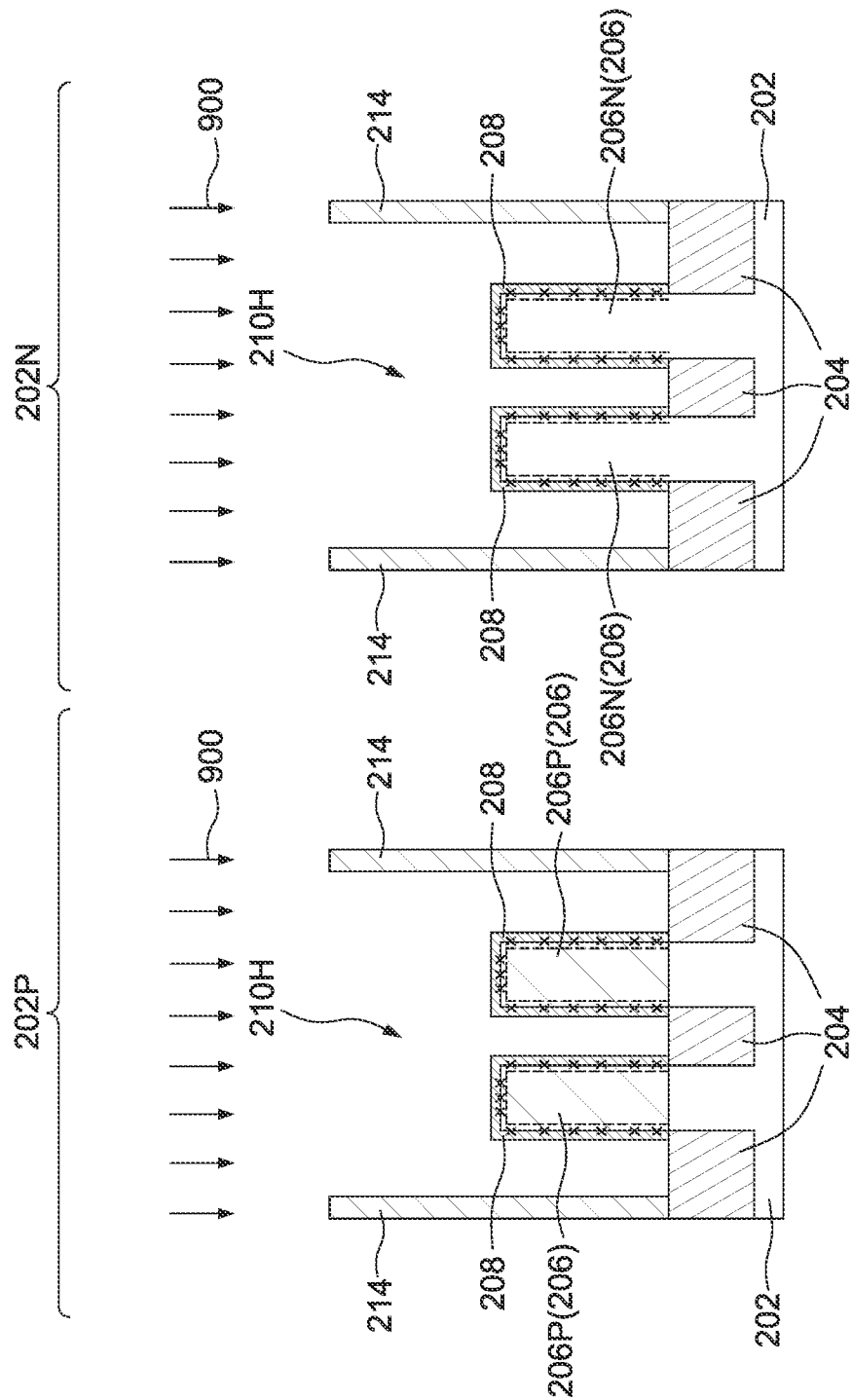
FIG. 10B is a cross-sectional view illustrated along a similar cross-section as reference cross-section C-C in FIG. 9.
Figure 11:
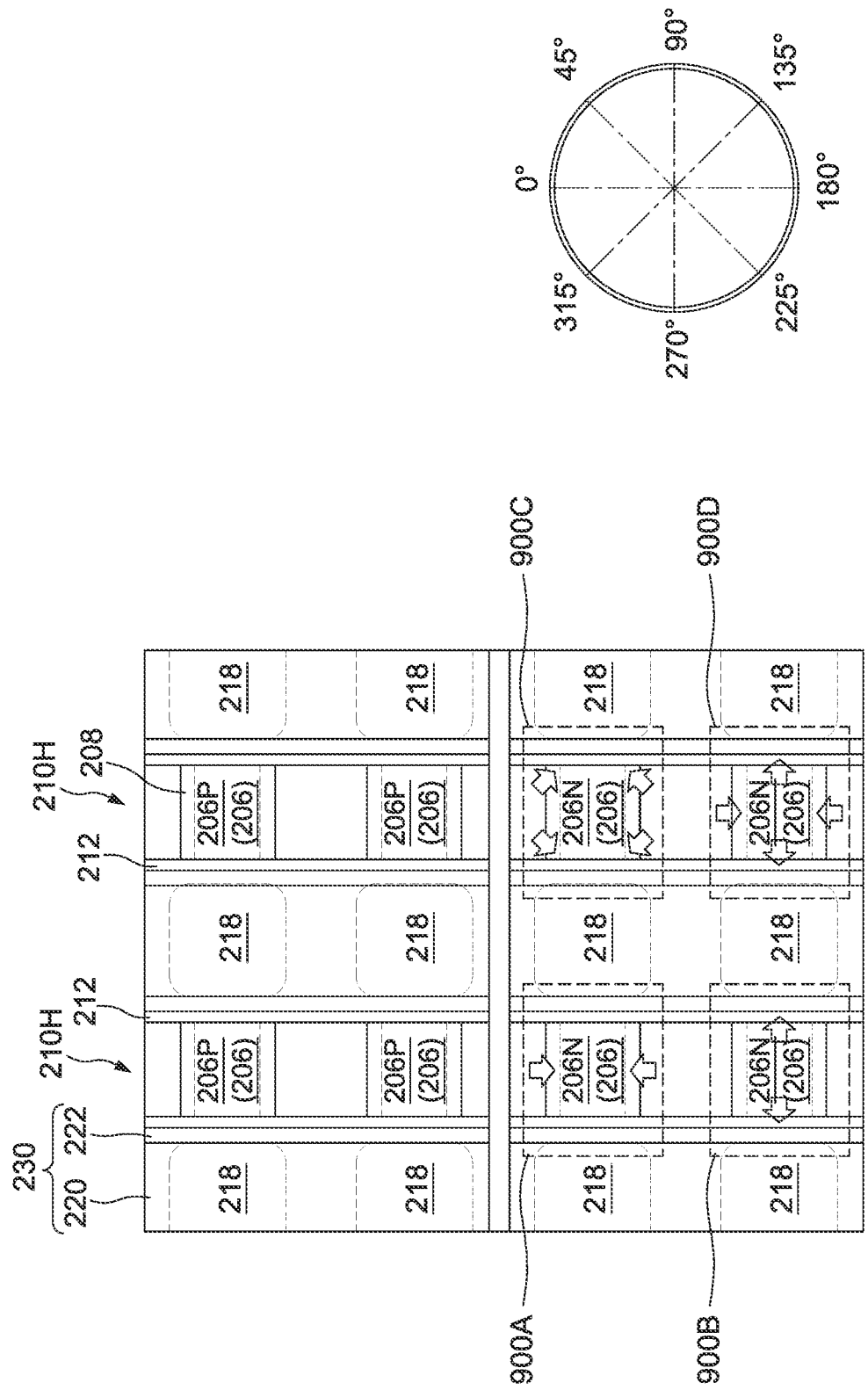
FIG. 11 is a top view illustrating a semiconductor structure at a fabrication stage constructed according to aspects of the present disclosure.

FIG. 9 is a schematic drawing illustrating the semiconductor structure 20 at a fabrication stage constructed according to aspects of the present disclosure in one or more embodiments. FIG. 10A is a cross-sectional view illustrated along a similar cross-section as reference cross-section A-A (n-type region 202N) and reference cross-section B-B (p-type region 202P) in FIG. 9, and FIG. 10B is a cross-sectional view illustrated along a similar cross-section as reference cross-section C-C in FIG. 9. Further, FIG. 11 is a top view illustrating the semiconductor structure 20 at a fabrication stage constructed according to aspects of the present disclosure in one or more embodiments.

Referring to FIGS. 9, 10A and 10B, an ion implantation 900 is performed to a portion of the fin structure 206 covered by the sacrificial dielectric layer 208 (if present) in the gate trench 210H, according to operation 106. In some embodiments, the ion implantation 900 may be referred to as a surface treatment which is performed over the fin structure 206 under the sacrificial dielectric layer 208 (if present) in the gate trench 210H. In some embodiments where a planar device is to be formed, the ion implantation 900 is performed over the substrate 202. In some embodiments, the ion implantation 900 is performed prior to the removal of the sacrificial dielectric layer 208. In some embodiments where the ion implantation 900 is performed is prior to the removal of the sacrificial dielectric layer 208, the sacrificial dielectric layer 208 is configured as a buffer layer for alleviating the bombardment energy of the ion implantation 900. In alternative embodiments, the ion implantation 900 may be performed after the sacrificial dielectric layer 208 is removed. In such embodiments, the ion implantation 900 may be performed directly on the fin structure 206 or the substrate 202.

The energy of the ion implantation 900 should be small or within a range so that the ion implantation 900 may not damage the channel region of the fin structure 206 under the sacrificial dielectric layer 208. In some embodiments, an energy of the ion implantation 900 ranges from approximately 0.1 keV to approximately 2 keV. In some embodiments, if the energy of the ion implantation 900 is greater than 2 keV, dopants of ion implantation 900 may penetrate through the channel region of the fin structure 206. In such embodiments, the fin structure 206 under the sacrificial dielectric layer 208 may suffer from severe damage. Thus, the device performance of the semiconductor structure 20 may be reduced. In some embodiments, if the energy of the ion implantation 900 is lower than 0.1 keV, dopants of ion implantation 900 may not be able to reach the fin structure 206 under the sacrificial dielectric layer 208. In such embodiments, the surface treatment over the fin structure 206 may not be enough to address the gate length non-uniformity issues.

In some embodiments, the ion implantation 900 includes a fluorination treatment process or a fluorine ion implantation. In some embodiments, a gas source of the fluorination treatment process includes boron fluoride ($BF_2$). In some embodiments, a dose range of the boron fluoride ranges from approximately $5\times10^{14}$ (ions/cm$^2$) to approximately $5\times10^{15}$ (ions/cm$^2$). In some embodiments, an energy of the boron fluoride ranges from approximately 0.1 keV to approximately 1.5 keV. In some embodiments, an operating temperature of the boron fluoride ranges from approximately 0 degree Celsius to approximately 50 degrees Celsius. In some embodiments, the operating temperature of the boron fluoride is about room temperature. In some embodiments, a gas source of the fluorination treatment process includes silicon fluoride ($SiF_3$). In some embodiments, a dose range of the silicon fluoride ranges from approximately $1\times10^{14}$ (ions/cm$^2$) to approximately $2\times10^{15}$ (ions/cm$^2$). In some embodiments, an energy of the silicon fluoride ranges from approximately 0.5 keV to approximately 2 keV. In some embodiments, an operating temperature of the silicon fluoride ranges from approximately 100 degrees Celsius to approximately 200 degrees Celsius. In some embodiments, the operating temperature of the silicon fluoride is about 150 degrees Celsius.

The ion implantation 900 may be configured to break a bonding between the atoms of the fin structures 206. In other words, dopants of the ion implantation 900 may break a bonding between the atoms of the fin structures 206. For example, fluorine dopants of the ion implantation 900 may break a bonding between the silicon atoms of the fin structures 206. The atoms of the fin structures 206 may have dangling bonds after the treatment of the ion implantation 900. In some embodiments, the dopants from the ion implantation 900 may pair with the atoms of the fin structures 206 having the dangling bonds. For example, the fluorine dopants of the ion implantation 900 may pair with the silicon atoms of the fin structures 206 having the dangling bonds. A silicon fluoride compound having a formula of $Si_xF_y$ may be formed between the fin structures 206 and the sacrificial dielectric layer 208. In some embodiments, at least a portion of the fin structures 206 is consumed to form the silicon fluoride compound. In some embodiments, at least a portion of the atoms of the fin structures 206 having the dangling bonds are not pair with the dopants from the ion implantation 900. In other embodiments where a planar device is to be formed, the ion implantation 900 may be configured to break a bonding between the atoms of the substrate 202. In such embodiments, the atoms of the substrate 202 may have dangling bonds after the treatment of the ion implantation 900.

Referring to FIG. 10A, in some embodiments, the ion implantation 900 may be configured to form a doped region 206F in the fin structure 206. In some embodiments, the dopants (i.e., fluorine dopants) introduced by the ion implantation 900 forms the doped region 206F in the fin structure 206. In some embodiments, the concentration of the fluorine dopants in the doped region 206F of the fin structure 206 may be substantially constant. In some other embodiments, the concentration of the fluorine dopants in the doped region 206F may vary along a depth direction. By way of example, the concentration of the fluorine dopants in the doped region 206F may increase along the depth direction from an upper surface distal to the substrate 202 to a bottom surface proximal to the substrate 202. The concentration of the fluorine dopants in the doped region 206F may decrease along the depth direction from the upper surface to the bottom surface. In some embodiments, the concentration of the fluorine dopants in the doped region 206F may vary along the depth direction in a continuous manner, or in a multi-stage manner.

In some embodiments, the dopants (i.e., fluorine dopants) may also be introduced to the spacer 212 during the ion implantation 900. In some embodiments, the ion implantation 900 may be configured to form doped spacers 212. In some embodiments, a top portion of the spacer 212 may include the fluorine dopants after the ion implantation 900. In some embodiments, the concentration of the fluorine dopants in the top portion of the spacer 212 may be substantially constant. In some other embodiments, the concentration of the fluorine dopants in the spacer 212 may vary along the depth direction. In some embodiments, the concentration of the fluorine dopants in the top portion of the spacer 212 is greater than the concentration of the fluorine dopants in the sidewall portion of the spacer 212. In some embodiments, the fluorine dopants in the spacer 212 may facilitate decreasing the k value (dielectric constant) of the spacer 212. In some embodiments, the spacer 212 includes a reduced k value after the ion implantation 900. In other words, the doped spacers 212 may have a reduced dielectric constant. In some embodiments, the k value of the spacer 212 may be dropped by approximately 3 percent to approximately 5 percent. In some embodiments, the concentration of the fluorine dopants in the spacer 212 is substantially less than the concentration of the fluorine dopants in the doped region 206F.

In some embodiments, the dopants may also be introduced to the dielectric structure 230 during the ion implantation 900. In some embodiments, a top portion of the dielectric structure 230 may include the fluorine dopants after the ion implantation 900. In some embodiments, the ion implantation 900 may be configured to form a doped dielectric structure 230. In some embodiments, the concentration of the fluorine dopants in the top portion of the dielectric structure 230 may be substantially constant. In some other embodiments, the concentration of the fluorine dopants in the dielectric structure 230 may vary along the depth direction. In some embodiments, the concentration of the fluorine dopants in the top portion of the dielectric structure 230 may be substantially same as the concentration of the fluorine dopants in the top portion of the spacer 212. In some embodiments, the concentration of the fluorine dopants in the top portion of the dielectric structure 230 may be substantially same as the concentration of the fluorine dopants in the doped region 206F of the fin structure 206.

Still Referring to FIG. 10A, a central region 206C of the fin structure 206 and a peripheral region 206A of the fin structure 206 surrounding the central region 206C may undergo different degrees of ion implantation 900. For example, since the peripheral region 206A of the fin structure 206 is adjacent to the spacers 212, less fluorine dopants may be able to reach the peripheral region 206A of the fin structure 206 due to the shielding effect. In contrast, the central region 206C of the fin structure 206 is not shielded by the spacers 212, and thus the central region 206C of the fin structure 206 may suffer from more ion implantation 900. In some embodiments, more silicon fluoride compound may be formed in the central region 206C of the fin structure 206 and less silicon fluoride compound may be formed in the peripheral region 206A of the fin structure 206. In some embodiments, more silicon atoms in the central region 206C of the fin structure 206 are consumed to form the silicon fluoride compound, and less silicon atoms in the peripheral region 206A of the fin structure 206 are consumed to form the silicon fluoride compound. In some embodiments, the ion implantation 900 may substantially have minor influence on the source/drain (S/D) structures 218 since the source/drain (S/D) structures 218 are protected by the dielectric structure 230.

Referring to FIG. 10B, the sidewalls and top surfaces of the fin structures 206 may substantially undergo a same degree of ion implantation 900 since the fin structures 206 are not shielded by the spacers 212 or the insulating structure 214 in the reference cross-section C-C. In other words, an equally number of fluorine dopants may be introduced to the sidewalls and the top surfaces of the fin structures 206. In some embodiments, an amount of silicon fluoride compound formed on the sidewalls of the fin structures 206 may be substantially equal to an amount of silicon fluoride compound formed on the top surfaces of the fin structures 206. In some embodiments, a number of silicon atoms on the sidewalls of the fin structures 206 consumed to form the silicon fluoride compound and a number of silicon atoms on the top surfaces of the fin structures 206 consumed to form the silicon fluoride compound are substantially the same. In some other embodiments, the sidewalls and top surface of the fin structure 206 may undergo different degrees of ion implantation 900. In such embodiments, the concentration of the fluorine dopants in the top portion of the fin structure 206 may be greater than the concentration of the fluorine dopants in the sidewall portion of the fin structure 206. In some embodiments, the concentration of the fluorine dopants in the top portion of the fin structure 206 is substantially same as the concentration of the fluorine dopants in the dielectric structure 230. In some embodiments, the concentration of the fluorine dopants in the sidewall portion of the fin structure 206 is substantially same as the concentration of the fluorine dopants in the spacer 212.

In some embodiments, the dopants may also be introduced to the insulating structure 214 during the ion implantation 900. In some embodiments, the insulating structure 214 may include the fluorine dopants after the ion implantation 900. In some embodiments, the ion implantation 900 may be configured to form a doped insulating structure 214. In some embodiments, the concentration of the fluorine dopants in the insulating structure 214 may be substantially constant. In some other embodiments, the concentration of the fluorine dopants in the insulating structure 214 may vary along the depth direction. In some embodiments, the concentration of the fluorine dopants in the insulating structure 214 may be substantially same as the concentration of the fluorine dopants in the spacer 212. In some embodiments, the concentration of the fluorine dopants in the sidewall portion of the fin structure 206 is substantially same as the concentration of the fluorine dopants in the insulating structure 214.

Referring to FIG. 11, the ion implantation 900 may have different incidence angles depending on different implementations. For example, take the center of the fin structure 206 as an origin, and the ion implantation 900 may performed to the fin structure 206 with reference to eight compass directions (i.e., 0, 45, 90, 135, 180, 225, 270, and 315 degrees). In some embodiments as shown in region 900A, the ion implantation 900 is performed to the fin structure 206N (206) from a direction of 0 degree and a direction of 180 degrees. In some embodiments as shown in region 900B, the ion implantation 900 is performed to the fin structure 206N (206) from a direction of 90 degrees and a direction of 270 degrees. In some embodiments as shown in region 900C, the ion implantation 900 is performed to the fin structure 206N (206) from direction of 45 degrees, a direction of 135 degrees, a direction of 225 degrees and a direction of 315 degrees. In some embodiments as shown in region 900D, the ion implantation 900 is performed to the fin structure 206 from a direction of 0 degree, a direction of 90 degrees, a direction of 180 degrees and a direction of 270 degrees.

FIGS. 12A through 15B illustrating the semiconductor structure 20 at various fabrication stages constructed according to aspects of the present disclosure in one or more embodiments. Further, FIGS. 12A, 13A, 14A, and 15A are cross-sectional views illustrated along a similar cross-section as reference cross-section A-A (n-type region 202N) and reference cross-section B-B (p-type region 202P) in FIG. 9. FIGS. 12B, 13B, 14B, and 15B are cross-sectional views illustrated along a similar cross-section as reference cross-section C-C in FIG. 9.

Figure 12A:
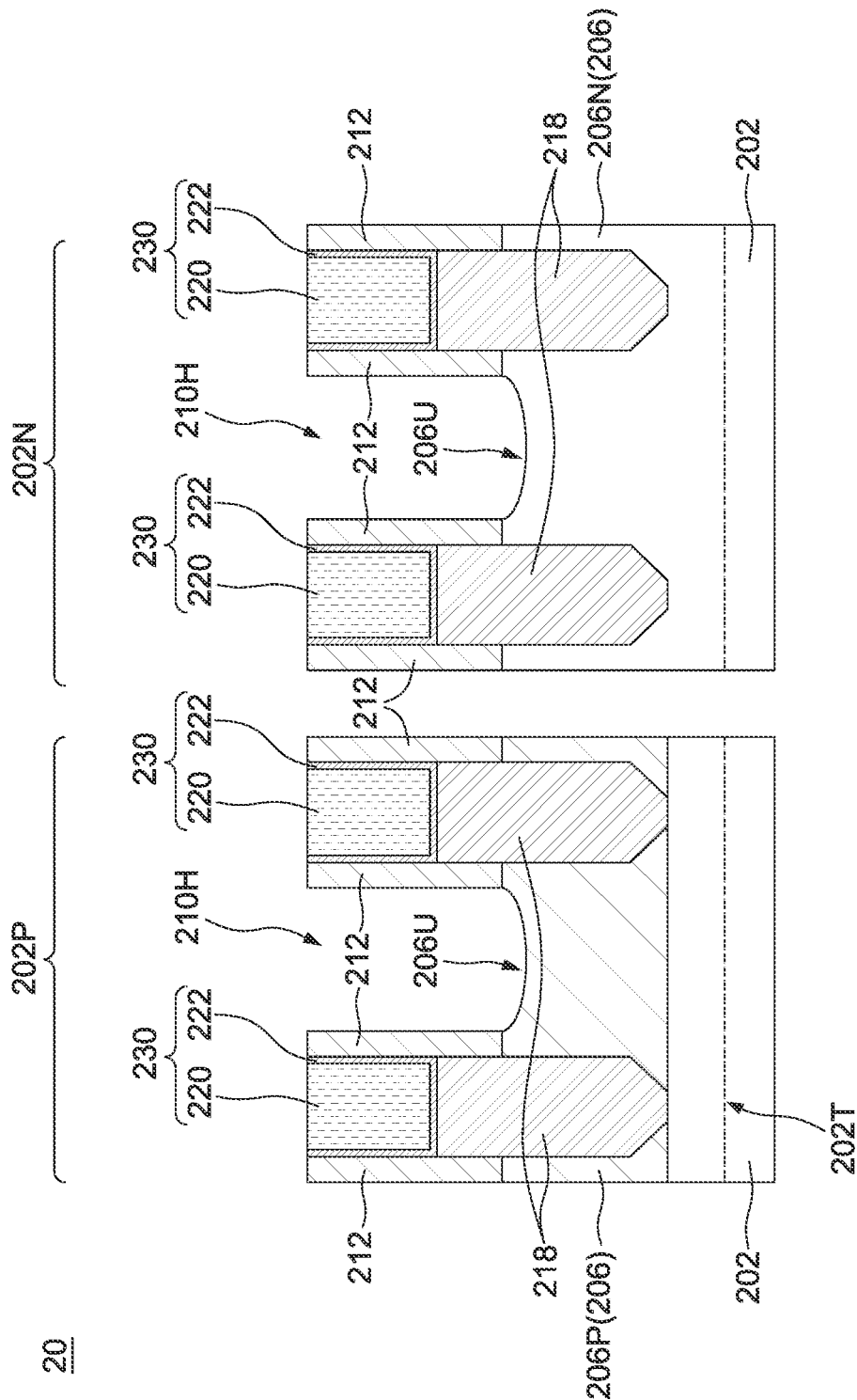
FIGS. 12A, 12B, 13A, 13B, 14A, 14B, 15A and 15B illustrating a semiconductor structure at various fabrication stages constructed according to aspects of the present disclosure.

Referring to FIG. 12A, the sacrificial dielectric layer 208 is removed. In some embodiments, the sacrificial dielectric layer 208 is removed to expose the fin structure 206 of the substrate 202 from the gate trench 210H, according to operation 108. In some embodiments, the removing of the sacrificial dielectric layer 208 from the fin structure 206 may form a curved upper surface 206U of the fin structure 206. Since the ion implantation 900 may form a silicon fluoride compound between the fin structure 206 and the sacrificial dielectric layer 208, the silicon fluoride compound may be removed together with the removing of the removing of sacrificial dielectric layer 208, leaving the curved upper surface 206U of the fin structure 206. In other words, the surface treatment of the ion implantation 900 may facilitate the forming of the curved upper surface 206U of the fin structure 206. The curved upper surface 206U of the fin structure 206 may create a shrink space for the materials used to form the metal gate structure subsequently. In some embodiments, at least a portion of the doped region 206F of the fin structure 206 is remained in the fin structure 206 after the removal of the sacrificial dielectric layer 208. In some embodiments, at least a portion of the sacrificial dielectric layer 208 is remained at a corner created between a sidewall surface of the fin structure 206, a sidewall surface of the spacer 212, and an upper surface of the isolation structure 204, after the removal of the sacrificial dielectric layer 208.

Figure 12B:
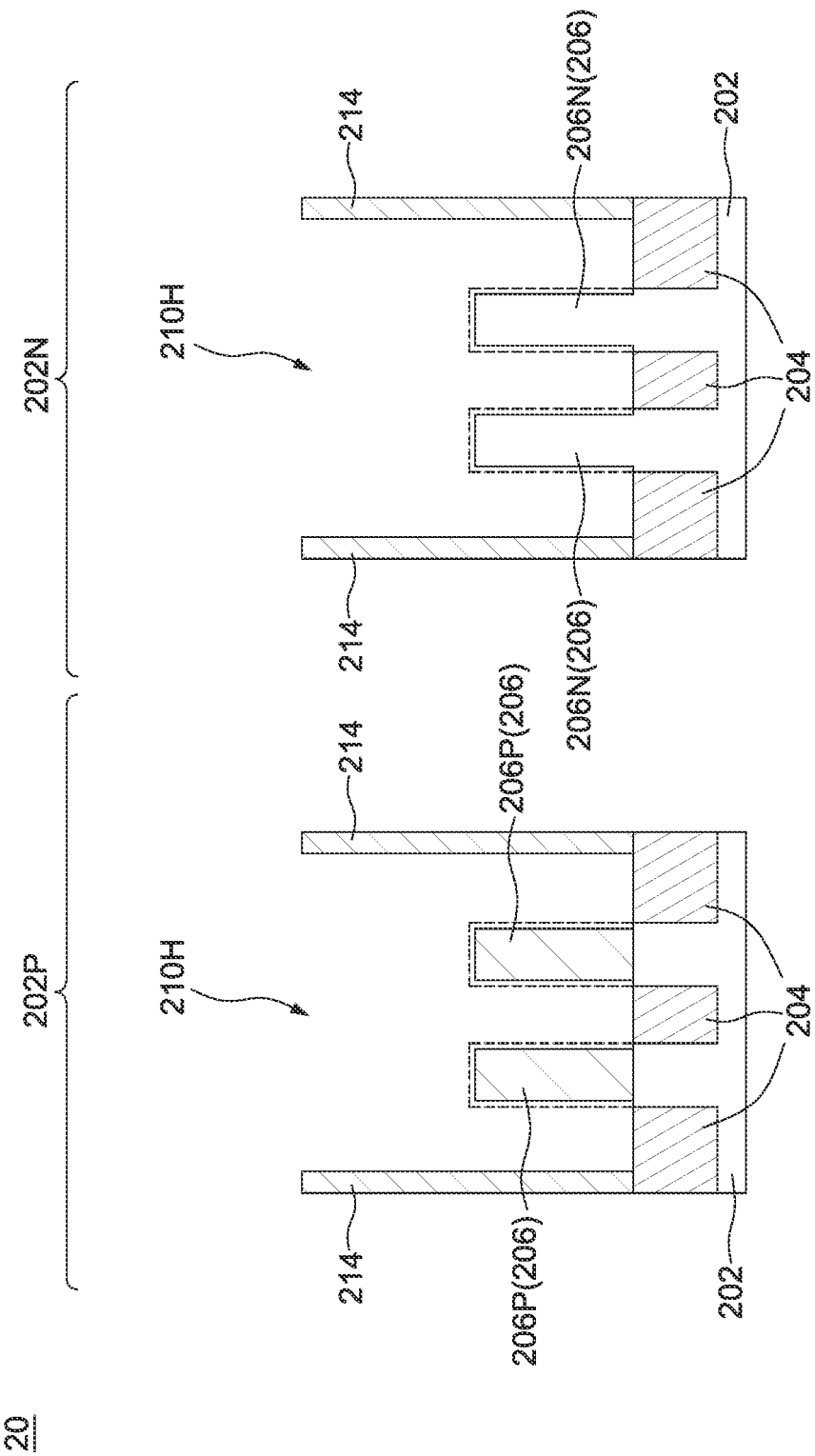

Referring to FIG. 12B, the removing of the sacrificial dielectric layer 208 may form a shrinking fin structure 206. For example, since the ion implantation 900 may form the silicon fluoride compound over the sidewalls and top surfaces of the fin structures 206, the silicon fluoride compound may be removed together with the removing of the removing of sacrificial dielectric layer 208, leaving a shrinking fin structure 206.

Figure 13A:
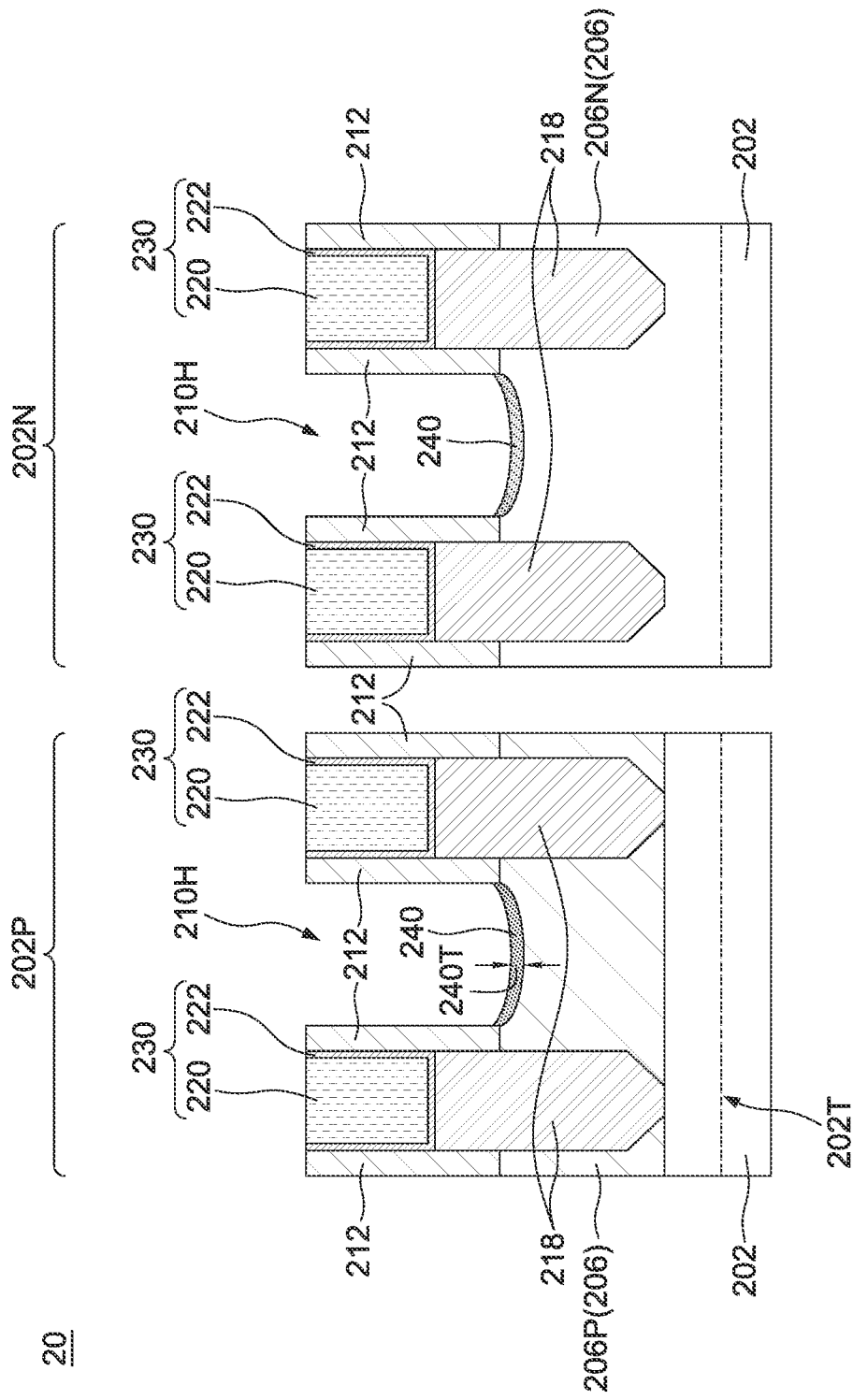
Figure 13B:
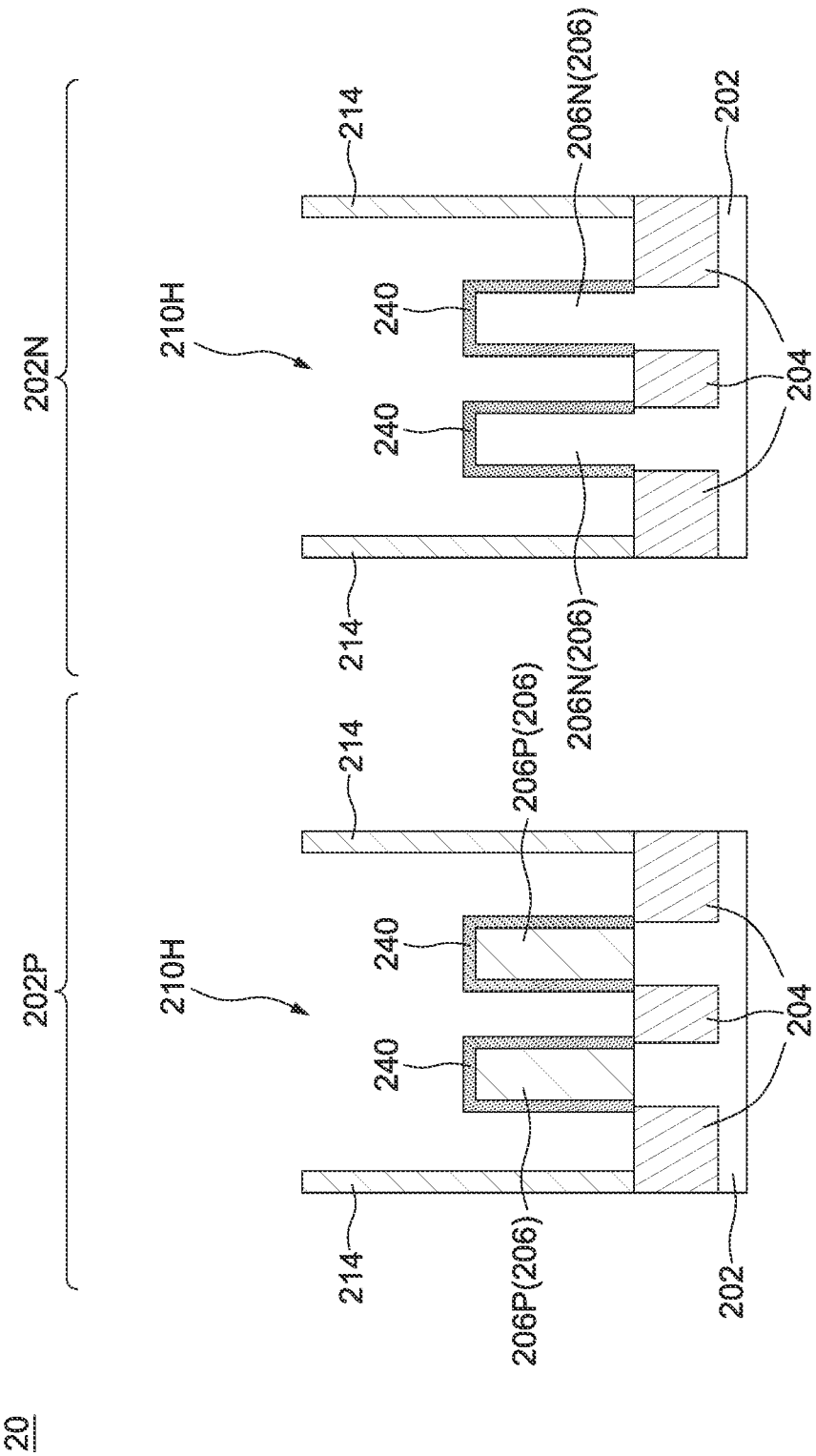

Referring to FIG. 13A, an interfacial layer (IL) 240 is formed over the fin structures 206 of the substrate 202 in the gate trench 210H, according to operation 110. In some embodiments, the IL 240 covers the portions of fin structure 206 in the gate trench 210H. In some embodiments, the IL 240 may only cover the fin structure 206, while the spacer 212 or the dielectric structure 230 are not covered by the IL 240. In some embodiments, the IL 240 is conformally formed over the fin structures 206. Thus, the IL 240 may have a curved top surface resembling to the shape of the curved upper surface 206U of the fin structure 206. Referring to FIG. 13B, the IL 240 may cover the top surfaces and sidewalls of the fin structures 206.

In some embodiments, the IL 240 is formed by a chemical oxidation. In some embodiments, the IL 240 is formed by a wet oxidation. The IL 240 may be formed by forcing an oxidizing agent to diffuse into the fin structure 206 and react with the fin structure 206. In some embodiments, the IL 240 incorporates silicon consumed from the fin structure 206 and oxygen supplied from the ambient or the oxidizing agent. In some embodiments, the IL 240 grows both down into the fin structure 206 and up out of it. The IL 240 may include an oxide-containing material such as SiO or SiON. In some embodiments, the IL 240 is formed by pairing the silicon atoms of the fin structures 206 having the dangling bonds with the oxygen atoms. Examples of oxidizing agent may be, for example but not limited thereto, $H_3PO_4$, $NH_4OH$, HCl, $H_2O_2$ and/or $O_3$.

In some other embodiments, the IL 240 may be formed by a deposition process such as chemical vapor deposition (CVD), atomic layer deposition (ALD), or the like. The IL 240 may be formed of oxide-containing materials such as silicon oxide, but not limited thereto. In such embodiments, the IL 240 may be formed to cover the fin structure 206, the spacer 212, the dielectric structure 230, and the insulating structure 214. In some embodiments, the IL 240 is conformally formed over the fin structures 206, the spacer 212, the dielectric structure 230, and the insulating structure 214. The presence of the IL 240 over the fin structures 206, the spacer 212, the dielectric structure 230, and the insulating structure 214 may create a shrink space for the materials used to form the metal gate structure subsequently. For example, since the IL 240 is formed over the sidewalls of the spacers 212, the space between the spacers 212 over the fin structure 206 is decreased. Further, the space between the spacers 212 over the isolation structure 204 is also decreased. Thus, the metal gate structure formed subsequently may have smaller footings or may substantially have no footings over the fin structure 206. Further, the metal gate structure formed subsequently may have smaller footings or may substantially have no footings over the isolation structure 204.

In some embodiments where at least a portion of the sacrificial dielectric layer 208 is remained at a corner between the sidewall surface of the fin structure 206, the sidewall surface of the spacer 212, and the upper surface of the isolation structure 204, the IL 240 may be also formed over the portion of the sacrificial dielectric layer 208. Thus, the portion of the sacrificial dielectric layer 208 may be interposed between the fin structure 206, spacer 212, isolation structure 204 and the IL 240.

In some embodiments as shown in FIG. 13A, a thickness 240T of the IL 240 may be consistent measured along a direction substantially perpendicular to the upper surface 202T of the substrate 202. In some embodiments, the thickness of the IL 240 may be in the range of approximately 10.5 angstroms to approximately 11.5 angstroms. In some comparative embodiments, when the operation 106 is omitted, a thickness of the IL may be approximately 10 angstroms. The ion implantation 900 may facilitate the forming of dangling bonds of the fin structures 206. Thus, the thickness of the IL 240 of the present embodiment may be increased as compared to the comparative embodiment due to the increasing of dangling bonds of the fin structure 206 through performing the ion implantation 900.

In some embodiments, the curved upper surface of the IL 240 may create a shrink space for the materials used to form the metal gate structure 250. Accordingly, the metal gate structure 250 formed subsequently may have smaller footings or may substantially have no footings. Thus, the method 10 for forming the semiconductor structure 20 mitigates the gate length non-uniformity issues, and the device performance of the semiconductor structure 20 may be improved.

In some embodiments, the metal gate structure 250 is formed over the IL 240 in the gate trench 210H, according to operation 112. In some embodiments, a metal gate structure 250 is formed by operations described in FIGS. 14A, 14B, 15A and 15B, but the disclosure is not limited thereto. The metal gate structure 250 may have a metal gate structure 250N disposed in the n-type region 202N and a metal gate structure 250P disposed in the p-type region 202P.

Figure 14A:
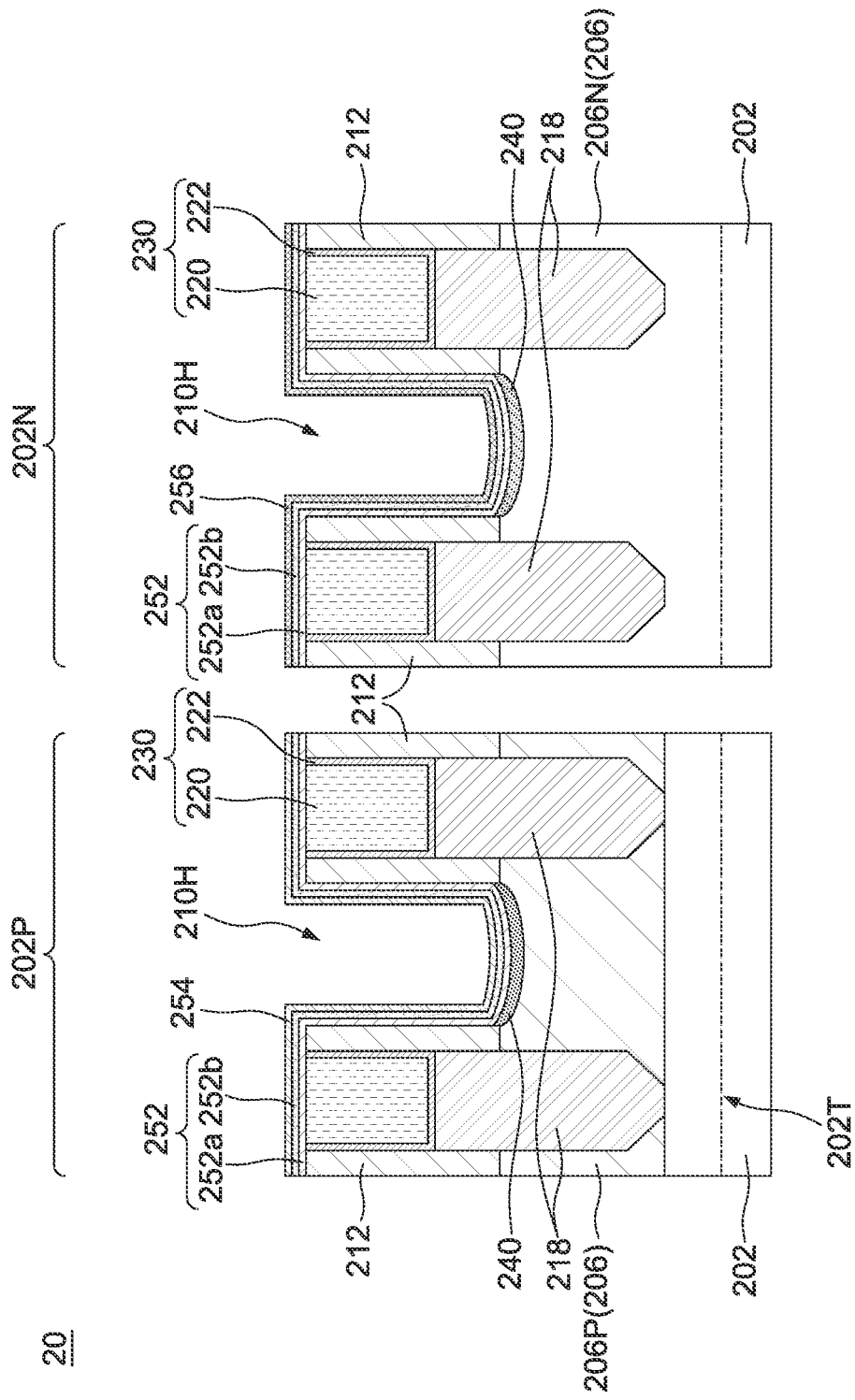
Figure 14B:
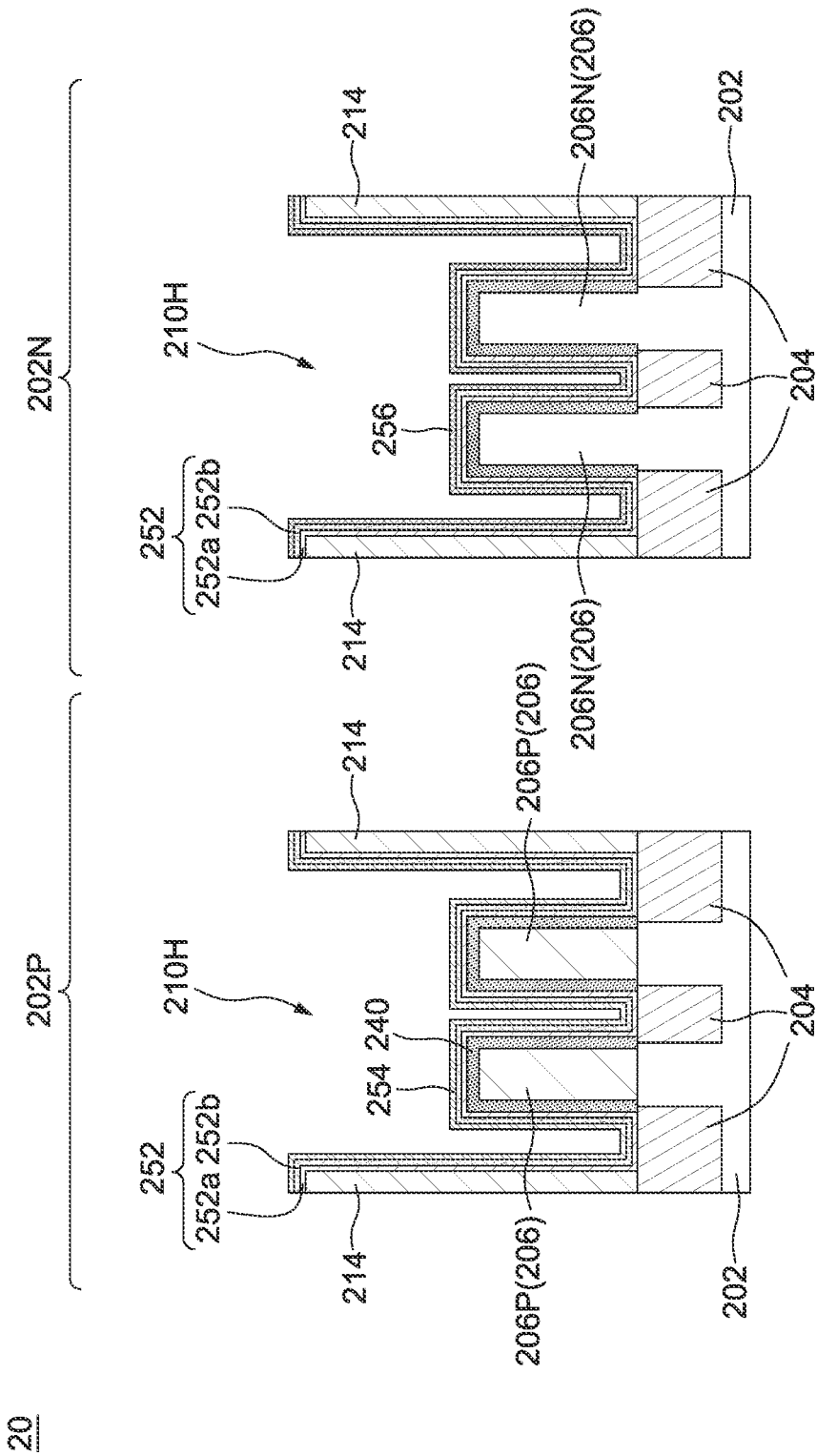

Referring to FIGS. 14A and 14B, the forming of the metal gate structure 250 further includes forming a gate dielectric layer 252 over the IL 240 in the gate trench 210H. In some embodiments, the gate dielectric layer 252 may include a single-layered structure or a multiple layered structure. For example, the gate dielectric layer 252 may be a bi-layered structure as shown in FIGS. 14A and 14B, but the disclosure is not limited thereto. In some embodiments, the bi-layered gate dielectric layer 252 may include a first high-k dielectric layer 252a and a second high-k dielectric layer 252b. The first and second high-k dielectric layers 252a and 252b may include high-k dielectric materials having a high dielectric constant, for example, greater than that of thermal silicon oxide (~3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), hafnium oxynitride ($HfO_xN_y$), other suitable metal-oxides, or combinations thereof. The first and second high-k dielectric layers 252a and 252b may include different high-k dielectric materials. For example, the first high-k dielectric layer 252a may include hafnium oxide, while the second high-k dielectric layer 252b may include aluminum oxide and lanthanum oxide. In some embodiments, the gate dielectric layer 252 is conformally formed over the IL 240. Thus, the gate dielectric layer 252 may have a curved top surface resembling to the shape of the curved top surface of the IL 240. In some embodiments, a thickness of the gate dielectric layer 252 is consistent measured along a direction substantially perpendicular to the upper surface 202T of the substrate 202.

Still referring to FIGS. 14A and 14B, the forming of the metal gate structure 250 further includes forming work function metal layers 254 and 256 over the gate dielectric layer 252 in the gate trench 210H. In some embodiments, after the forming of the gate dielectric layer 252, the work function metal layer 254 is formed on the gate dielectric layer 252 in the p-type region 202P, and the work function metal layer 256 is formed on the gate dielectric layer 252 in the n-type region 202N. The work function metal layer 254 and the work function metal layer 256 may include a single-layered structure or a multiple layered structure. For the p-type region 202P, the work function metal layer 254 may include a single layer of TiAlC, Al, TiAl, TaN, TaAlC, TiN, TiC or Co, or a multilayer of two or more of these materials, but is not limited thereto. For the n-type region 202N, the work function metal layer 256 may include a single layer of TaN, TaAlC, TiN, TiC, Co, TiAl, HfTi, TiSi or TaSi, or a multilayer of two or more of these materials, but is not limited thereto. In some embodiments, the work function metal layers 254 and 256 are sequentially formed over the gate dielectric layer 252 in the p-type region 202P and the n-type region 202N, respectively. In some embodiments, the work function metal layers 254 and 256 are simultaneously formed over the gate dielectric layer 252 in the p-type region 202P and the n-type region 202N, respectively. In some embodiments, the work function metal layers 254 and 256 are conformally formed over the gate dielectric layer 252. Thus, the work function metal layers 254 and 256 may have curved top surfaces resembling to the shape of the curved top surface of the gate dielectric layer 252. In some embodiments, a thickness of the work function metal layer 254 is consistent measured along a direction substantially perpendicular to the upper surface 202T of the substrate 202. In some embodiments, a thickness of the work function metal layer 256 is consistent measured along a direction substantially perpendicular to the upper surface 202T of the substrate 202.

Figure 15A:
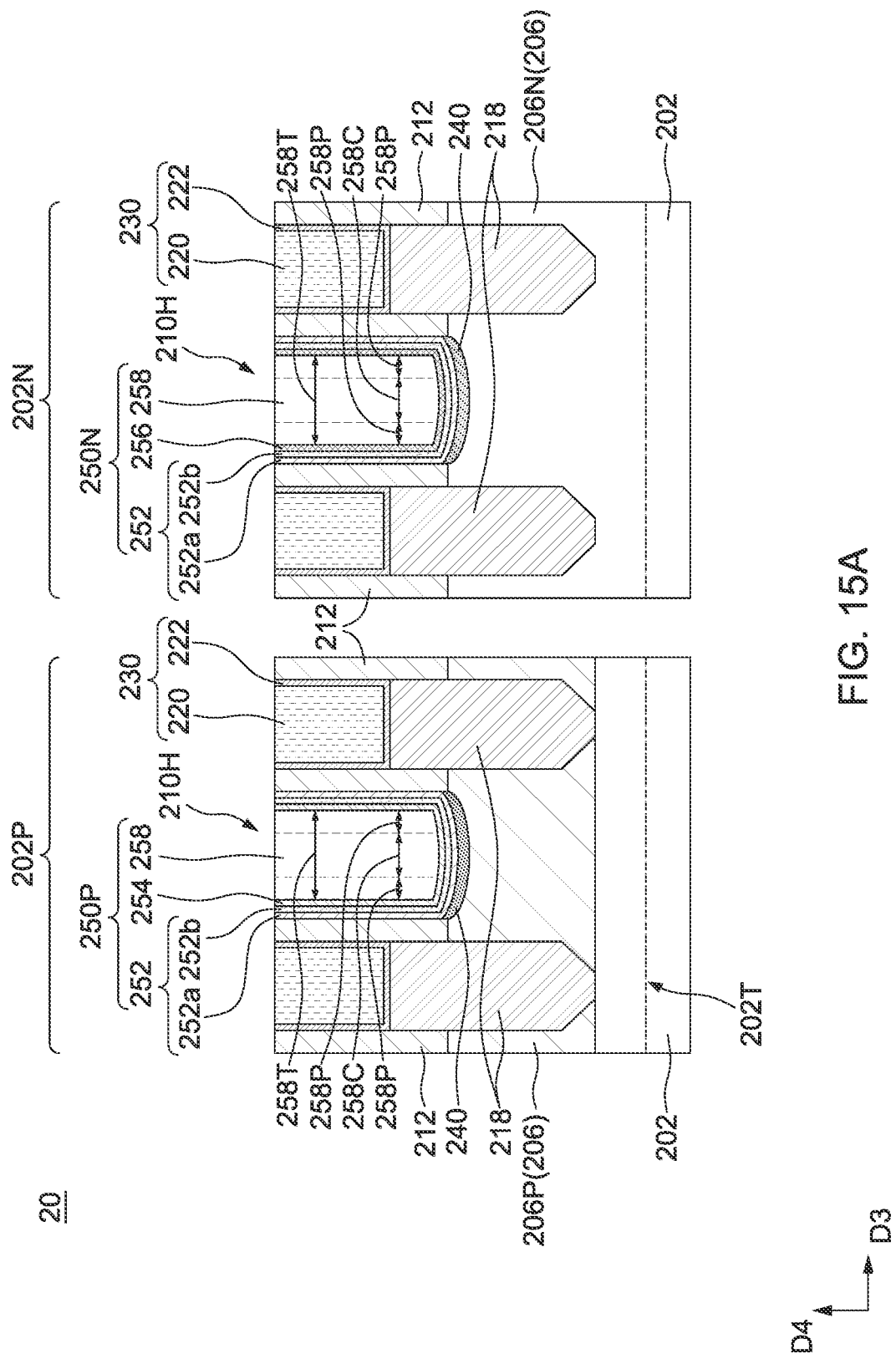
Figure 15B:
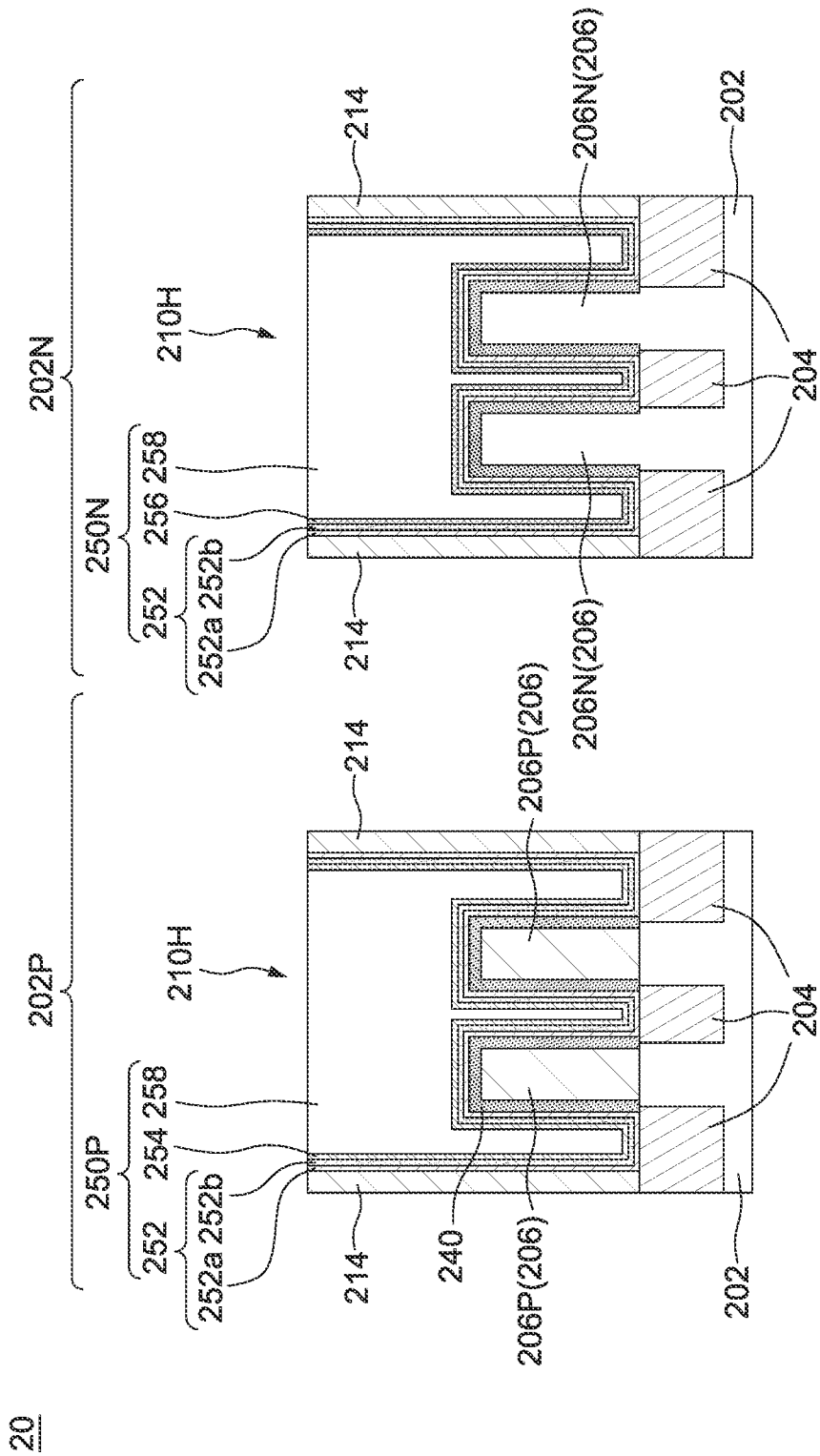

Referring to FIGS. 15A and 15B, the forming of the metal gate structure 250 further includes forming a gap-fill metal layer 258 over the work function metal layers 254 and 256 filling the gate trench 210H. For the p-type region 202P, the gap-fill metal layer 258 is formed on the work function metal layer 254. For the n-type region 202N, the gap-fill metal layer 258 is formed on the work function metal layer 256. The gap-fill metal layer 258 includes any acceptable material of a low resistance. For example, the gap-fill metal layer 258 may be formed of a metal such as Ru, Co, Al, Cu, AlCu, W, combinations thereof or the like, but is not limited to the above-mentioned materials. The gap-fill metal layer 258 may be deposited by ALD, CVD, PVD, or the like. In some embodiments, the gap-fill metal layer 258 is deposited by a non-conformal process. For example, the gap-fill metal layer 258 is deposited in a gap-fill manner. The gap-fill metal layer 258 may completely fill the remaining portions of the gate trench 210H. Since the work function metal layers 254 and 256 have a curved top surface, the gap-fill metal layer 258 may have a curved bottom surface.

In some embodiments, a planarization process, such as a CMP, may be performed to remove the excess portions of the gate dielectric layer 252, the work function metal layers 254, 256 and the gap-fill metal layer 258, which excess portions are over the top surfaces of the dielectric structure 230. Top surfaces of the gate dielectric layer 252, the work function metal layers 254, 256 and the gap-fill metal layer 258, the dielectric structure 230 and the spacers 212 are coplanar (within process variations) after the planarization process is completed. For the p-type region 202P, the remaining portions of the gate dielectric layer 252, the work function metal layer 254 and the gap-fill metal layer 258 in the gate trench 210H form the metal gate structure 250P. For the n-type region 202N, the remaining portions of the gate dielectric layer 252, the work function metal layer 256 and the gap-fill metal layer 258 in the gate trench 210H form the metal gate structure 250N. The metal gate structure 250P and the metal gate structure 250N may be collectively referred to as the metal gate structure 250 in the following description.

In some embodiments, a thickness 258T of the gap-fill metal layer 258, measured along a direction D3 substantially parallel to an upper surface 202T of the substrate 202, varies along a direction D4 substantially perpendicular to the upper surface 202T of the substrate 202. Additionally, the direction D3 may be parallel to the first direction D1. In some embodiments, the gap-fill metal layer 258 has a central portion 258C and a peripheral portion 258P surrounding the central portion 258C. In some embodiments, a bottom surface of the central portion 258C is lower than a bottom surface of the peripheral portion 258P, from a cross-sectional view crossing the fin structures 206. In some embodiments, the metal gate structure 250 has a height over the fin structures 206, wherein the height is measured along the direction D4 substantially perpendicular to the upper surface 202T of the substrate 202. In some embodiments, the height of the metal gate structure 250 ranges from approximately 10 nanometers to approximately 20 nanometers.

Figure 16A:
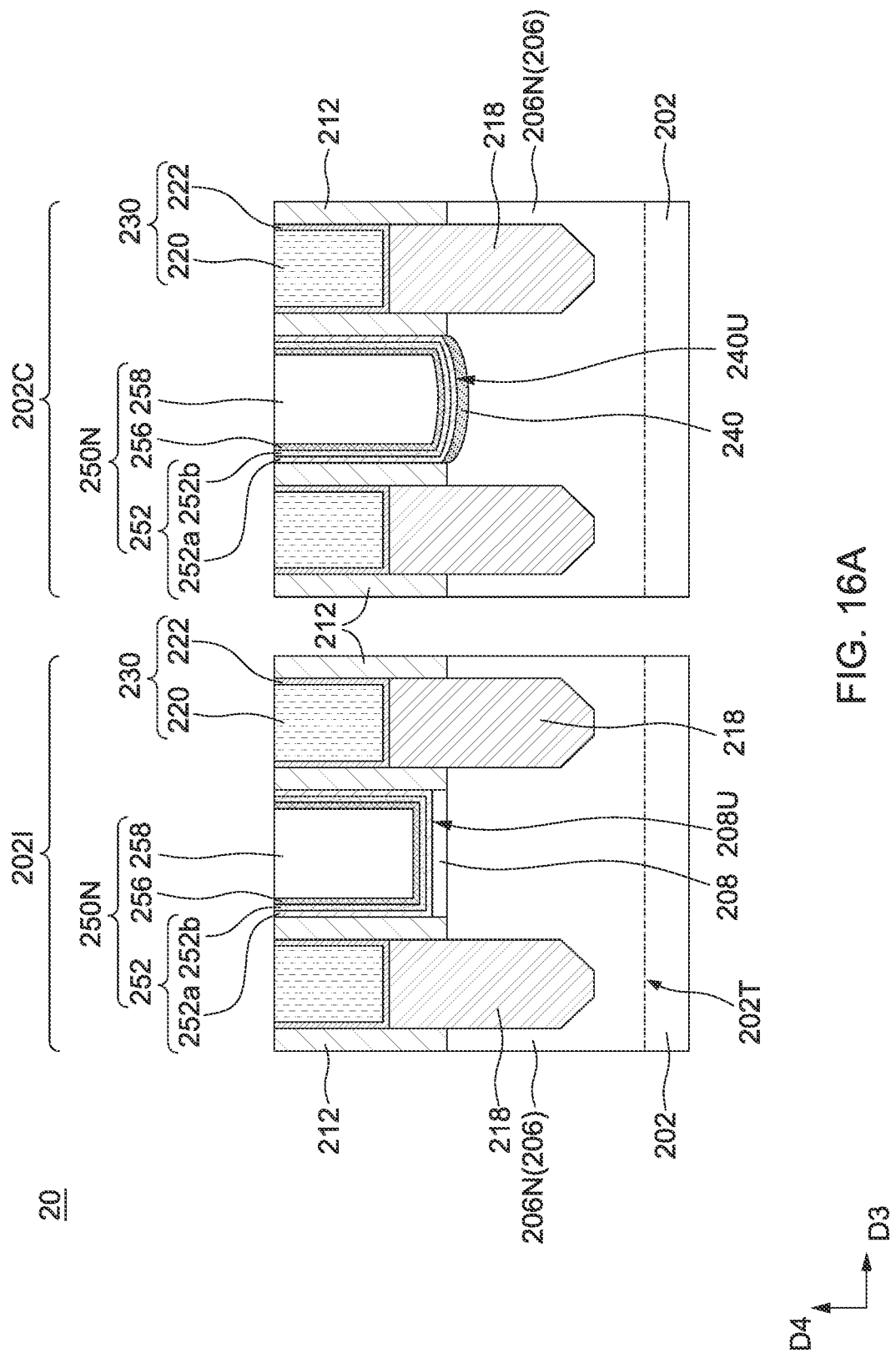
FIGS. 16A and 16B illustrating a semiconductor structure at a fabrication stage constructed according to aspects of the present disclosure.
Figure 16B:
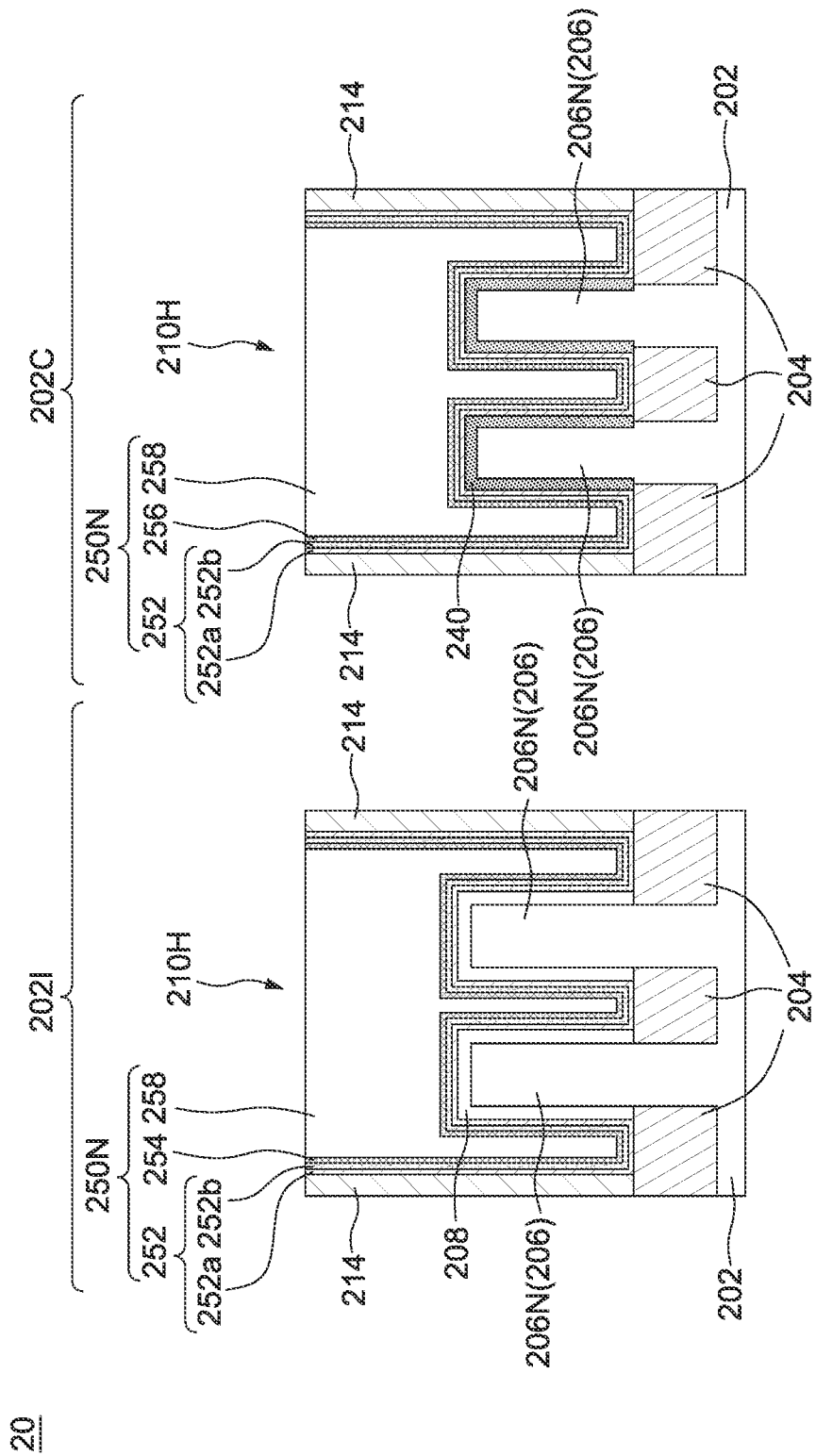

FIGS. 16A and 16B illustrating the semiconductor structure 20 at a fabrication stage constructed according to aspects of the present disclosure in one or more embodiments. Further, FIG. 16A is a cross-sectional view illustrated along a similar cross-section as reference cross-section A-A in FIG. 9, and FIG. 16B is a cross-sectional view illustrated along a similar cross-section as reference cross-section C-C in FIG. 9.

Referring to FIGS. 16A and 16B, it should be understood that the substrate 202 may include various device regions, such as a core logic region 202C and an input/output region 202I. The various device regions may include various devices. For example, the core logic region 202C may include logic devices and the input/output region 202I may include I/O FET devices. It should be also understood that different devices may require different elements. In some embodiments, when an I/O FET device is required, the sacrificial dielectric layer 208 may serve as an interfacial layer (IL). In other words, the sacrificial dielectric layer 208 is removed in a first region (e.g., the core logic region 202C) of the substrate 202 and remain in a second region (e.g., the input/output region 202I) of the substrate 202. The illustrated gate replacement process may be performed in the first region (e.g., the core logic region 202C) of the substrate 202, and another gate replacement process where the sacrificial dielectric layer 208 is not removed may be performed in the second region (e.g., the input/output region 202I) of the substrate 202.

In some embodiments as shown in FIG. 16A, the IL 240 in the core logic region 202C has a concave profile. In some embodiments, the concave profile of the IL 240 may define an upper boundary 240U lower than an upper surface of the fin structure 206 (or the substrate 202). In some embodiments, the interfacial layer (i.e., the sacrificial dielectric layer 208) in the input/output region 202I has an upper boundary 208U higher than the upper surface of the fin structure 206 (or the substrate 202). In some embodiments, the thickness of the interfacial layer (i.e., the sacrificial dielectric layer 208) in the input/output region 202I is greater than the thickness of the IL 240 in the core logic region 202C.

In the present disclosure, the method for forming the semiconductor structure includes introducing a surface treatment to the fin structure under the sacrificial dielectric layer. The surface treatment may facilitate the forming of dangling bonds of the fin structure (or the substrate). In some embodiments, a thickness of an interfacial layer formed over the fin structure may be increased as compared to a comparative embodiment where no surface treatment is involved. The thickness of the interfacial layer is increased due to the increasing of dangling bonds of the fin structure (or the substrate). The surface treatment may also facilitate the forming of a curved upper surface of the fin structure. The curved upper surface of the fin structure may create a shrink space for the materials used to form the metal gate. Accordingly, the metal gate formed thereon may have smaller footings or may substantially have no footings. Further, the metal gate formed thereon may have a shorter gate length. Thus, the device performance of the semiconductor structure may be improved.

In some embodiments, a method is provided. The method includes following operations. A sacrificial gate structure is formed over a fin structure. The sacrificial gate structure includes a sacrificial gate layer and a sacrificial dielectric layer. The sacrificial gate layer is removed to form a gate trench exposing the sacrificial dielectric layer. A doped region is formed in the fi structure covered by the sacrificial dielectric layer. The sacrificial dielectric layer, a portion of the doped region and a portion of the fin structure are removed from the gate trench. An interfacial layer is formed over the fin structure in the gate trench.

In some embodiments, a semiconductor structure is provided. The semiconductor structure includes source/drain structures, a metal gate structure over the source/drain structures, and an interfacial layer under the metal gate structure. The metal gate structure includes a gate dielectric layer, a work function metal layer and a gap-fill metal layer. A thickness of the gap-fill metal layer, which is measured from a first direction, varies along a second direction substantially perpendicular to the first direction. The interfacial layer has a concave profile. An upper surface of the source/drain structures is higher than an upper surface of the interfacial layer.

A semiconductor structure is provided. The semiconductor structure includes a semiconductor substrate, a first metal gate structure, a second metal gate structure, a first interfacial layer and a second interfacial layer. The semiconductor substrate has a first fin structure and a second fin structure. The first metal gate structure is over the first fin structure, and the second metal gate structure is over the second fin structure. The first interfacial layer is between the first fin structure and the first metal gate structure. The first interfacial layer has a concave profile. A topmost surface of the first fin structure is higher than a bottommost surface of the first interfacial layer. The second interfacial layer is between the second fin structure and the second metal gate structure. The second interfacial layer has a flat profile. A topmost surface of the second fin structure is aligned with a bottommost surface of the second interfacial layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a first fin structure over a semiconductor substrate;
    first source/drain structures;
    a first metal gate structure between the first source/drain structures and over the first fin structure, the first metal gate structure comprising a first gate dielectric layer, a first work function metal layer and a first gap-fill metal layer;
    a first interfacial layer between the first metal gate structure and the first fin structure, wherein the first interfacial layer has a concave profile;
    a doped spacer over a sidewall of the first metal gate structure, wherein the doped spacer comprises dopants different from that of the first source/drain structures;
    a second fin structure over the semiconductor substrate;
    second source/drain structures;
    a second metal gate structure between the second source/drain structures and over the second fin structure, the second metal gate structure comprising a second gate dielectric layer, a second work function metal layer and a second gap-filling metal layer; and
    a second interfacial layer between the second metal gate structure and the second fin structure, wherein the second interfacial layer has flat profile.

2. The semiconductor structure of claim 1, wherein the first gap-fill metal layer has a central portion and a peripheral portion surrounding the central portion, and a bottom surface of the central portion is lower than a bottom surface of the peripheral portion.

3. The semiconductor structure of claim 1, wherein a thickness of the first interfacial layer is consistent measured along a direction substantially perpendicular to an upper surface of the semiconductor substrate.

4. The semiconductor structure of claim 1, wherein a thickness of the first gap-filling metal layer varies along a direction substantially perpendicular to an upper surface of the semiconductor substrate.

5. The semiconductor structure of claim 1, wherein a concentration of dopants in the doped spacer varies along a direction substantially perpendicular to an upper surface of the semiconductor substrate.

6. The semiconductor structure of claim 1, wherein a thickness of the first gap-filling metal layer is greater than a thickness of the second gap-filling metal layer.

7. The semiconductor structure of claim 1, wherein a thickness of the second gap-filling metal layer is consistent.

8. The semiconductor structure of claim 1, wherein a thickness of the second interfacial layer is greater than a thickness of the first interfacial layer.

9. The semiconductor structure of claim 1, wherein a bottom surface of the first interfacial layer is lower than a top surface of the first fin structure, and a bottom surface of the second interfacial layer is aligned with a top surface of the second fin structure.

10. A semiconductor structure, comprising:
    a semiconductor substrate having a first fin structure and a second fin structure separated from each other;
    a first metal gate structure over the first fin structure;
    a second metal gate structure over the second fin structure;
    a first interfacial layer between the first fin structure and the first metal gate structure, wherein the first interfacial layer has a concave profile, and a topmost surface of the first fin structure is higher than a bottommost surface of the first interfacial layer; and
    a second interfacial layer between the second fin structure and the second metal gate structure, wherein the second interfacial layer has a flat profile, and a topmost surface of the second fin structure is aligned with a bottommost surface of the second interfacial layer.

11. The semiconductor structure of claim 10, wherein the first metal gate structure comprises a first work function metal layer and a first gap-filling metal layer, the second metal gate structure comprises a second work function metal layer and a second gap-filling metal layer, and a thickness of the first gap-filling metal layer is greater than a thickness of the second gap-filling metal layer.

12. The semiconductor structure of claim 11, wherein the thickness of the first gap-filling metal layer varies along a direction perpendicular to the topmost surface of the first fin structure.

13. The semiconductor structure of claim 11, wherein the thickness of the second gap-filling metal layer is consistent.

14. A semiconductor structure, comprising:
    a first fin structure over a semiconductor substrate;
    first source/drain structures;
    a first metal gate structure between the first source/drain structures and over the first fin structure, the first metal gate structure comprising a first gate dielectric layer, a first work function metal layer and a first gap-fill metal layer;

an first interfacial layer between the first metal gate structure and the first fin structure, wherein the first interfacial layer has a concave profile;

a first doped spacer over a sidewall of the first metal gate structure, wherein the first doped spacer comprise dopants different from that of the first source/drain structures;

a second fin structure over the semiconductor substrate;

second source/drain structures;

a second metal gate structure between the second source/drain structures and over the second fin structure, the second metal gate structure comprising a second gate dielectric layer, a second work function metal layer and a second gap-fill metal layer;

a second interfacial layer between the second metal gate structure and the second fin structure, wherein the second interfacial layer has a concave profile; and a second doped spacer over a sidewall of the second metal gate structure, wherein the second doped spacer comprise dopants different from that of the second source/drain structures.

15. The semiconductor structure of claim 14, wherein the first gap-fill metal layer has a central portion and a peripheral portion surrounding the central portion, and a bottom surface of the central portion is lower than a bottom surface of the peripheral portion.

16. The semiconductor structure of claim 14, further comprising a doped insulating structure surrounding the first fin structure, the first metal gate structure and the first doped spacer.

17. The semiconductor structure of claim 16, wherein the doped insulating structure and the first doped spacer comprise same dopants.

18. The semiconductor structure of claim 14, wherein the first source/drain structures comprise a first doping type, the second source/drain structure comprise a second doping type, and the first doping type and the second doping type are complementary.

19. The semiconductor structure of claim 14, wherein the first doped spacer and the second doped spacer comprise same dopants.

20. The semiconductor structure of claim 19, wherein the first doped spacer and the second doped spacer comprise fluorine.

* * * * *